(12) United States Patent
Kiya

(10) Patent No.: US 11,326,881 B2
(45) Date of Patent: May 10, 2022

(54) VIBRATOR DEVICE, CIRCUIT DEVICE, METHOD OF MANUFACTURING VIBRATOR DEVICE, ELECTRONIC APPARATUS, AND VEHICLE

(71) Applicant: SEIKO EPSON CORPORATION, Tokyo (JP)

(72) Inventor: Hiroshi Kiya, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 691 days.

(21) Appl. No.: 16/242,129

(22) Filed: Jan. 8, 2019

(65) Prior Publication Data

US 2019/0212145 A1 Jul. 11, 2019

(30) Foreign Application Priority Data

Jan. 9, 2018 (JP) .............................. JP2018-001086

(51) Int. Cl.
| | | |
|---|---|---|
| *H01L 41/04* | (2006.01) | |
| *H03H 9/10* | (2006.01) | |
| *H03H 9/05* | (2006.01) | |
| *G01C 19/5628* | (2012.01) | |
| *G01C 19/5621* | (2012.01) | |
| *H03H 9/15* | (2006.01) | |
| *H03H 3/04* | (2006.01) | |
| *H01L 41/09* | (2006.01) | |
| *H03H 9/02* | (2006.01) | |

(52) U.S. Cl.
CPC ..... *G01C 19/5628* (2013.01); *G01C 19/5621* (2013.01); *H01L 41/04* (2013.01); *H01L 41/09* (2013.01); *H03H 3/04* (2013.01); *H03H 9/02102* (2013.01); *H03H 9/02133* (2013.01); *H03H 9/02149* (2013.01); *H03H 9/0519* (2013.01); *H03H 9/0552* (2013.01); *H03H 9/1021* (2013.01); *H03H 9/15* (2013.01)

(58) Field of Classification Search
CPC ........... H01L 41/04; H01L 41/09; H03H 9/15; H03H 3/04; H03H 9/1021
USPC ....................................................... 310/367
See application file for complete search history.

(56) References Cited

U.S. PATENT DOCUMENTS

2011/0089788 A1* 4/2011 Kikushima .............. H03H 9/13
                                                          310/370
2014/0015618 A1* 1/2014 Ishikawa .................. H03H 9/19
                                                          331/158

FOREIGN PATENT DOCUMENTS

JP    2004-286476 A    10/2004
JP    2013-074360 A    4/2013

\* cited by examiner

*Primary Examiner* — Derek J Rosenau
(74) *Attorney, Agent, or Firm* — Rankin, Hill & Clark LLP

(57) ABSTRACT

A vibrator device includes a vibrator having a first and second electrode, and a circuit device having a drive circuit adapted to drive the vibrator, and an output circuit adapted to output a monitor signal corresponding to a vibration characteristic of the vibrator while driven by the drive circuit. The circuit device includes a first terminal electrically connected to the first electrode, and from which an output signal from the drive circuit to the vibrator is output, a second terminal electrically connected to the second electrode, and to which an input signal from the vibrator to the drive circuit is input, a third terminal electrically separated from the first electrode and the second electrode, and a monitor terminal from which the monitor signal is output. The vibrator is supported on an active surface side of the circuit device using conductive bumps respectively to the first, second, and third terminal.

19 Claims, 20 Drawing Sheets

VIBRATOR DEVICE, CIRCUIT DEVICE, METHOD OF MANUFACTURING VIBRATOR DEVICE, ELECTRONIC APPARATUS, AND VEHICLE

BACKGROUND

1. Technical Field

The present invention relates to a vibrator device, a circuit device, a method of manufacturing a vibrator device, an electronic apparatus, a vehicle and so on.

2. Related Art

As the related art of a vibrator device using a vibrator, there are technologies disclosed in JP-A-2013-74360 (Document 1) and JP-A-2004-286476 (Document 2). Document 1 is a related art of an oscillator as one of the vibrator device, and discloses a frequency adjustment method of the vibrator. In the frequency adjustment method, a part of the vibrator is removed by irradiating the vibrator with an ion beam from an ion gun to thereby reduce the mass of the vibrator. On this occasion, by controlling an amount of the reduction of the mass using a shutter disposed between the vibrator and the ion gun, the oscillation frequency of the vibrator is adjusted. Document 2 is a related art of a gyro sensor (a physical quantity measurement device) as one of the vibrator device, and discloses an adjustment method of detection detuning of the vibrator. In this adjustment method, the detection detuning is measured based on a change of a leakage vibration signal when changing a resonant frequency in a vibration mode. Then, by adjusting at least one of the resonant frequency of the vibration in a drive mode and the resonant frequency of the vibration in the detection mode based on the measurement value, the detection detuning of the vibrator is adjusted.

By using such an adjustment method, it is possible to achieve an improvement in vibration characteristics of the vibrator. However, the characteristics of the vibrator vary in accordance with an environmental variation such as a temperature variation, or vary in accordance with a variation with time called aging. In the vibrator devices of, for example, Document 1 and Document 2, an adhesive is used in some cases in order to fix the vibrator to a package of the vibrator device. In such a case, if heat is applied to the adhesive, the vibration characteristics of the vibrator vary with time due to outgas and so on. Further, in the related art method, after performing the adjustment of the vibration characteristics of the vibrator as a simple body, the vibrator and the circuit device are installed in the package, and are then shipped out as a product. However, in the vibrator device in the condition of the product, the vibrator vibrates due to the drive circuit of the circuit device driving the vibrator. Therefore, an appropriate adjustment of the vibration characteristics is not achievable only by the adjustment of the vibration characteristics of the vibrator as a simple body.

SUMMARY

An advantage of some aspects of the invention is to solve at least a part of the problems described above, and the invention can be implemented as the following embodiments or aspects.

An aspect of the invention relates to a vibrator device including a vibrator having a first electrode and a second electrode, and a circuit device having a drive circuit configured to drive the vibrator, and an output circuit configured to output a monitor signal corresponding to a vibration characteristic of the vibrator while being driven by the drive circuit, wherein the circuit device includes a first terminal electrically coupled to the first electrode, and from which an output signal from the drive circuit to the vibrator is output, a second terminal electrically coupled to the second electrode, and to which an input signal from the vibrator to the drive circuit is input, and a third terminal electrically separated from the first electrode and the second electrode, and a monitor terminal from which the monitor signal is output, and the vibrator is supported on an active surface of the circuit device with conductive bumps provided respectively to the first terminal, the second terminal and the third terminal.

According to the aspect of the invention, the first and second terminals electrically connected to the first and second electrodes of the vibrator are provided to the circuit device, and the drive circuit of the circuit device can drive the vibrator via the first and second terminals. Further, the circuit device is further provided with the third terminal electrically separated from the first and second electrodes. Further, the vibrator is supported on the active surface side of the circuit device using the conductive bumps provided respectively to the first, second and third terminals. By adopting this configuration, it becomes possible to stably support the vibrator using the conductive bumps of the first, second and third terminals of the circuit device while setting the vibrator in the state in which the vibrator can be driven by the drive circuit of the circuit device. Therefore, since the vibrator and so on can be supported without using an adhesive or the like, or the amount of the adhesive used can be reduced, the environmental variation caused by the adhesive or the like can be suppressed, and since the environmental variation is suppressed, it becomes possible to achieve the improvement of the vibration characteristic of the vibrator. Further, since the circuit device includes the output circuit for outputting the monitor signal corresponding to the vibration characteristic of the vibrator while being driven by the drive circuit, and the monitor terminal from which the monitor signal is output, it is possible to realize an appropriate adjustment of the vibration characteristic by monitoring the signal from the monitor terminal while driving the vibrator with the drive circuit in the state in which the vibrator is supported by the circuit device. Therefore, it becomes possible to realize the stable support of the vibrator and the improvement of the vibration characteristic of the vibrator.

In the aspect of the invention, a first area and a second area may be sectioned by a center line in a plan view of the active surface of the circuit device, the first terminal and the second terminal may be disposed in the first area, and the third terminal may be disposed in the second area.

With this configuration, it becomes possible to stably support the vibrator using the conductive bumps of the first and second terminals disposed in the first area, and the conductive bump of the third terminal disposed in the second area.

In the aspect of the invention, the drive circuit may be disposed at a position nearer to the first terminal and the second terminal than to the third terminal.

With this configuration, it becomes possible to drive the vibrator using the first and second terminals disposed at the positions nearer to the drive circuit, and an influence of the parasitic capacitance and the parasitic resistance can be reduced.

In the aspect of the invention, the vibrator device may further include a relay substrate disposed between the vibrator and the circuit device, and having an interconnection electrically connecting the first terminal of the circuit device and the first electrode of the vibrator, and an interconnection electrically connecting the second terminal of the circuit device and the second electrode of the vibrator, in which the relay substrate may be supported by the conductive bumps of the first terminal, the second terminal and the third terminal of the circuit device, and the vibrator may be supported on the active surface side of the circuit device via the relay substrate.

With this configuration, by making the relay substrate intervene between the vibrator and the circuit device, the deformation due to the thermal deflection and so on of the circuit device and the package become difficult to reach the vibrator, and it becomes possible to suppress the deterioration of the vibration characteristic of the vibrator.

In the aspect of the invention, the circuit device may include a fourth terminal electrically separated from the first electrode and the second electrode, and the vibrator may be supported on the active surface of the circuit device with the conductive bumps provided respectively to the first terminal, the second terminal and the third terminal, and a conductive bump provided to the fourth terminal.

With this configuration, the four-point support or the like of the vibrator becomes possible, and thus, more stable support of the vibrator becomes possible.

In the aspect of the invention, the monitor terminal may be disposed at a position shifted from the vibrator in the plan view of the active surface of the circuit device.

With this configuration, it becomes possible to output the monitor signal of the vibration characteristic of the vibrator to the outside via the monitor terminal in the state in which the vibrator is driven by the drive circuit via the first and second terminals. Further, since the monitor terminal is disposed at the position not overlapping the vibrator in the plan view of the circuit device, it becomes easy to directly apply the probe to the monitor terminal. Therefore, the appropriate adjustment of the vibration characteristic of the vibrator becomes possible, and it becomes possible to achieve the improvement of the vibration characteristic.

In the aspect of the invention, the circuit device may include an oscillation circuit having the drive circuit, and configured to drive the vibrator with the drive circuit to oscillate the vibrator, and the output circuit may output the monitor signal based on a signal from the oscillation circuit.

With this configuration, it becomes possible to monitor the vibration characteristic such as the oscillation frequency of the vibrator using the monitor signal based on the signal from the oscillation circuit.

In the aspect of the invention, the circuit device may include a detection circuit configured to detect physical quantity information corresponding to a detection signal from the vibrator driven by the drive circuit based on the detection signal, and the output circuit may output the monitor signal based on a signal from the detection circuit.

With this configuration, it becomes possible to monitor the vibration characteristic of the vibrator related to, for example, the physical quantity information detected by the detection circuit using the monitor signal based on the signal from the detection circuit.

In the aspect of the invention, the monitor signal may be a signal representing the vibration characteristic varying by an adjustment when the vibrator is processed to adjust the vibration characteristic.

With this configuration, if the adjustment of the vibration characteristic by performing the process on the vibrator is performed and the vibration characteristic of the vibrator changes, it becomes possible to monitor the vibration characteristic varying in accordance with the adjustment using the monitor signal, and thus, the appropriate adjustment of the vibration characteristic becomes possible.

In the aspect of the invention, an area of the monitor terminal may be larger than an area of each of the first terminal, the second terminal and the third terminal.

By making the area of the monitor terminal larger as described above, it becomes easy to apply the probe to the monitor terminal, and it becomes possible to achieve the improvement of the work efficiency of the adjustment of the vibration characteristic.

In the aspect of the invention, the circuit device may have a rectangular shape in the plan view of the active surface, and the monitor terminal may be disposed in one corner region out of four corner regions of the circuit device.

By disposing the monitor terminal in the corner region as described above, in the case of, for example, supporting the circuit device by the probe applied to the terminal, it becomes possible to stably support the circuit device with the probe.

In the aspect of the invention, the circuit device may include a first power supply terminal to which high potential side power is supplied when monitoring the vibration characteristic, and a second power supply terminal to which low potential side power is supplied when monitoring the vibration characteristic, and the first power supply terminal and the second power supply terminal may be disposed in other corner regions than the one corner region out of the four corner regions.

By disposing the first and second power supply terminals as described above, it becomes possible to supply the circuit device with the power to operate the circuit device. Further, by disposing the monitor terminal, and the first and second power supply terminals in the corner regions of the circuit device, more stable support of the circuit device with the probe and so on becomes possible.

In the aspect of the invention, the circuit device may have a signal terminal to electrically be connected to an external terminal of the vibrator device, and the signal terminal may be disposed at a position shifted from the vibrator in the plan view of the active surface of the circuit device.

With this configuration, it becomes possible to easily realize the electrical connection between the signal terminal and the external terminal of the vibrator device.

In the aspect of the invention, a height in a cross-sectional view of the signal terminal may be higher than a height in the cross-sectional view of the monitor terminal.

By making the height in the cross-sectional view of the signal terminal higher as described above, it becomes possible to stably connect the signal terminal to the internal terminal and so on.

In the aspect of the invention, the circuit device may be mounted face-down to a package of the vibrator device.

With this configuration, it becomes possible to efficiently and compactly mount the vibrator and the circuit device to the package.

Another aspect of the invention relates to a circuit device including a drive circuit configured to drive a vibrator having a first electrode and a second electrode, a first terminal electrically coupled to the first electrode, and from which an output signal from the drive circuit to the vibrator is output, a second terminal electrically coupled to the second electrode, and to which an input signal from the vibrator to the drive circuit is input, and a third terminal electrically separated from the first electrode and the second electrode, wherein the first terminal, the second terminal and the third terminal are respectively provided with conductive bumps adapted to support the vibrator on an active surface side of the circuit device.

According to the aspect of the invention, it becomes possible to stably support the vibrator using the conductive bumps of the first, second and third terminals of the circuit device while setting the vibrator in the state in which the vibrator can be driven by the drive circuit of the circuit device, and thus, it becomes possible to achieve the improvement and so on of the vibration characteristic of the vibrator.

Still another aspect of the invention relates to a method of manufacturing a vibrator device including the steps of manufacturing a circuit device having a drive circuit configured to drive a vibrator having a first electrode and a second electrode, a first terminal from which an output signal from the drive circuit to the vibrator is output, a second terminal to which an input signal from the vibrator to the drive circuit is input, and a third terminal, and arranging the vibrator and the circuit device so that the first terminal and the first electrode are electrically connected, the second terminal and the second electrode are electrically connected, and the vibrator is supported on an active surface of the circuit device with conductive bumps provided to the first terminal, the second terminal and the third terminal.

According to the aspect of the invention, it becomes possible to manufacture a vibrator device capable of stably supporting the vibrator using the conductive bumps of the first, second and third terminals of the circuit device while setting the vibrator in the state in which the vibrator can be driven by the drive circuit of the circuit device.

Still another aspect of the invention relates to an electronic apparatus including any one of the vibration devices described above.

Still another aspect of the invention relates to a vehicle including any one of the vibration devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the measures for solving the problem of the invention.

1. Vibrator Device

Figure 1:
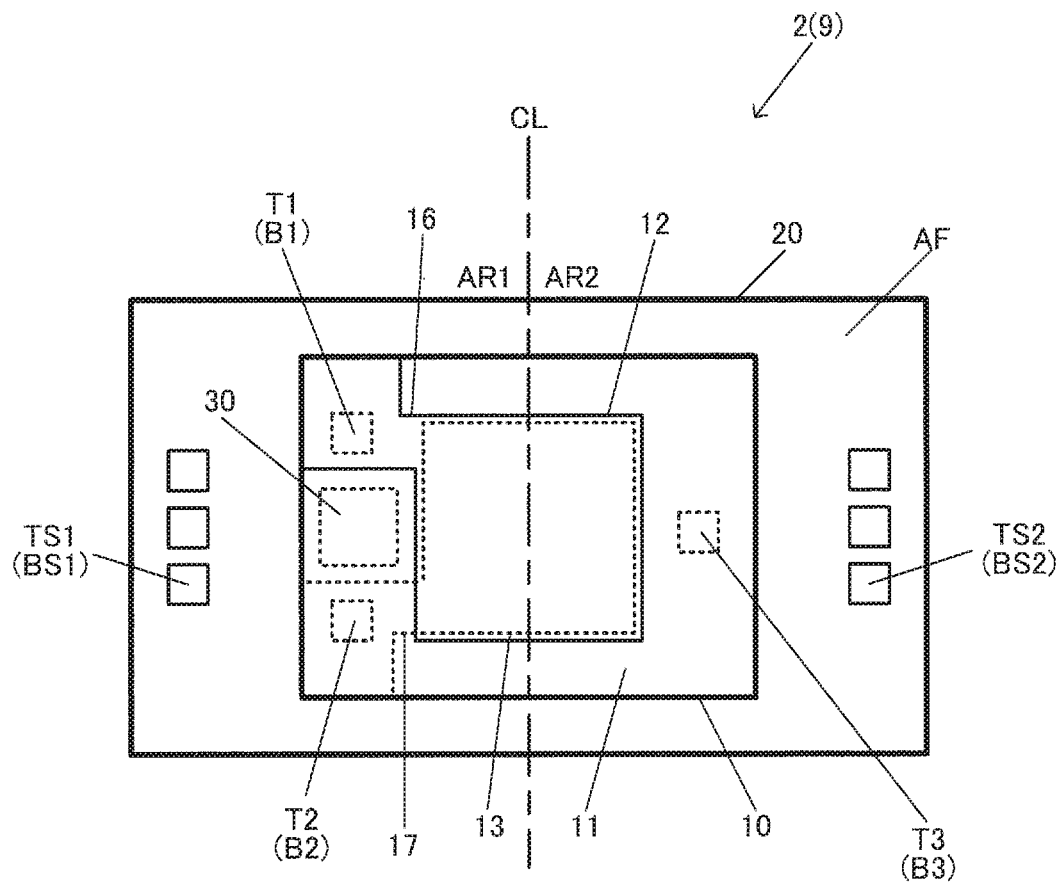
FIG. 1 is a plan view showing a configuration example of a vibrator device according to the embodiment.
Figure 2:
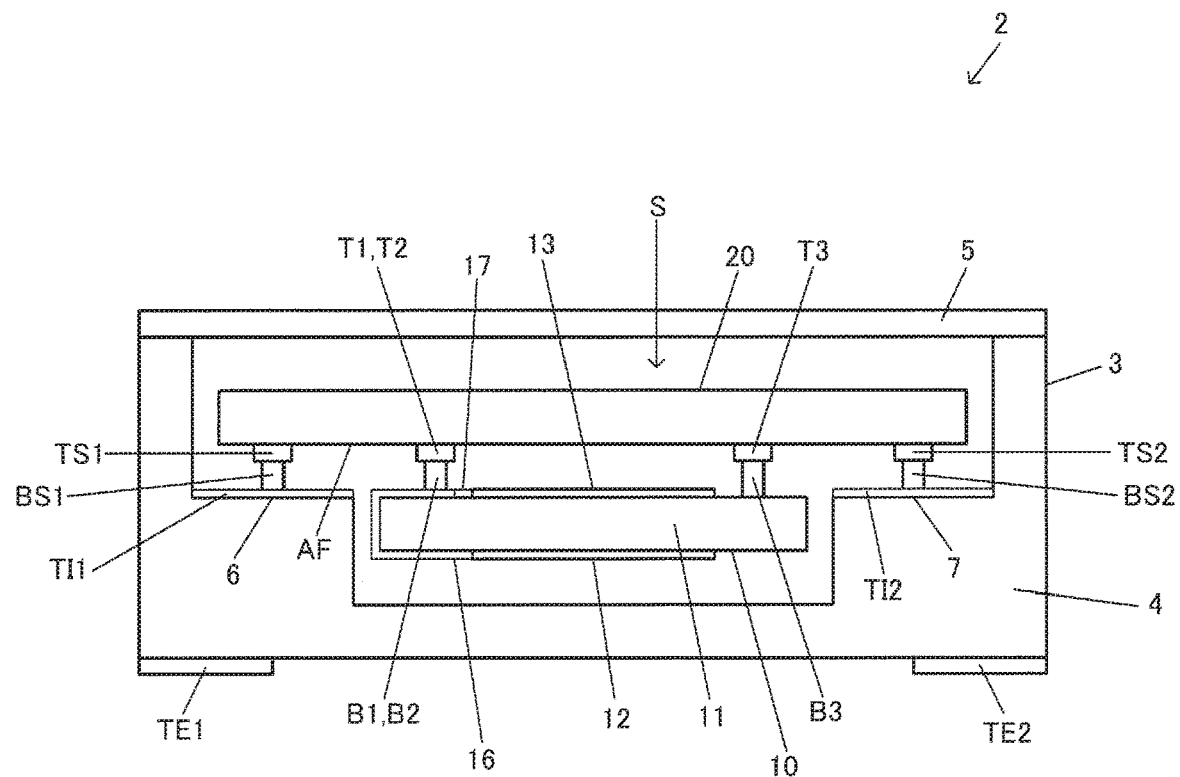
FIG. 2 is a cross-sectional view showing a configuration example of the vibrator device according to the embodiment.
Figure 2:
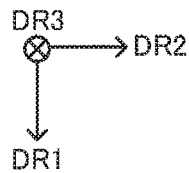

FIG. 1 and FIG. 2 show a configuration example of a vibrator device 2 according to the present embodiment. FIG. 1 is a plan view showing the vibrator device 2 according to the present embodiment, and FIG. 2 is a cross-sectional view (a side view). The vibrator device 2 includes a vibrator 10 and a circuit device 20 having a drive circuit 30 for driving the vibrator 10. Further, vibrator device 2 can further include a package 3 in which the vibrator 10 and the circuit device 20 are installed. The vibrator 10 is disposed on an active surface AF side (a circuit element surface side) of the circuit device 20. The active surface AF is a surface of the circuit device 20 on which an active element (a circuit element) such as a transistor is formed. In FIG. 1 and FIG. 2, the direction from the circuit device 20 toward the vibrator 10 is defined as DR1 (a first direction). The direction DR1 is a direction perpendicular to a semiconductor substrate of the circuit device 20. Further, directions perpendicular to the direction DR1 are defined as directions DR2, DR3 (second and third directions). The direction DR2 is, for example, a direction along a long side direction of the circuit device 20, and the direction DR3 is a direction along a short side direction. It should be noted that the vibrator device 2 is not limited to the configuration shown in FIG. 1 and FIG. 2, but it is possible to make a variety of practical modifications such as elimination of some of the constituents or addition of other constituents.

The vibrator 10 (resonator) is an element (a vibrating element) for generating a mechanical vibration due to an electrical signal. The vibrator 10 can be realized by a vibrator element (a piezoelectric vibrator element) such as a quartz crystal vibrator element. The vibrator 10 can be realized by a quartz crystal vibrator element vibrating in a thickness-shear mode having the cutting angle of, for example, AT-cut or SC-cut. The vibrator 10 is, for example, a vibrator incorporated in a temperature-compensated oscillator (TCXO) not provided with a constant-temperature oven. Alternatively, the vibrator 10 can also be a vibrator incorporated in an oven-controlled oscillator (OCXO) equipped with a constant-temperature oven. It should be noted that the vibrator 10 according to the present embodiment can be realized by a variety of vibrator elements such as a vibrator element other than the thickness shear vibration type or a piezoelectric vibrator element formed of a material other than the quartz crystal. For example, as the vibrator 10, it is also possible to adopt a surface acoustic wave (SAW) resonator, an MEMS (micro electro-mechanical systems) vibrator as a silicon vibrator formed using a silicon substrate, and so on.

The vibrator 10 has a vibrator element 11 (a vibrating substrate) and electrodes 12, 13. The vibrator element 11 is formed of a piezoelectric material such as quartz crystal. In the case of defining a surface of the vibrator element on the opposite direction side to the circuit device 20 as a first surface, and a surface on the circuit device 20 side as a second surface, the electrode 12 is formed on the first surface of the vibrator element 11, and the electrode 13 is formed on the second surface. Further, the vibrator 10 has a terminal not shown, and is electrically connected to a terminal of the circuit device 20 via this terminal.

The circuit device 20 (an integrated circuit device) has a rectangular shape in a planer view of the active surface AF, and has a semiconductor substrate, and an active element such as a transistor is formed on the active surface AF of the semiconductor substrate. Further, it is also possible to form a passive element such as a resistor or a capacitor on the active surface AF. It should be noted that the rectangular shape mentioned here is not necessarily complete one, but one partially including a convex shape or a concave shape, and one having a side including a curve are also allowed.

The circuit device 20 has the drive circuit 30 for driving the vibrator 10. Further, the circuit device 20 has a terminal T1 (a first terminal) which is electrically connected to the electrode 12 (a first electrode) of the vibrator 10, and from which an output signal from the drive circuit 30 to the vibrator 10 is output, and a terminal T2 (a second terminal) which is electrically connected to the electrode 13 (a second electrode) of the vibrator 10, and to which an input signal from the vibrator 10 to the drive circuit 30 is input. Further, the circuit device 20 further has a terminal T3 (a third terminal) which is not electrically connected to the electrodes 12, 13 (the first and second electrodes) of the vibrator 10. Further, it is also possible for the circuit device 20 to have signal terminals TS1, TS2 to which a variety of signals are input or from which a variety of signals are output. These terminals T1, T2, T3 and the signal terminals TS1, TS2 are those called, for example, pads of the circuit device 20. It should be noted that the expression of electrically connected denotes connection in which an electrical signal is transmitted via an interconnection or the like to thereby reach the destination, and the expression of not electrically connected denotes that the transmission of the electrical signal is blocked to thereby fail to reach the destination.

Figure 3:
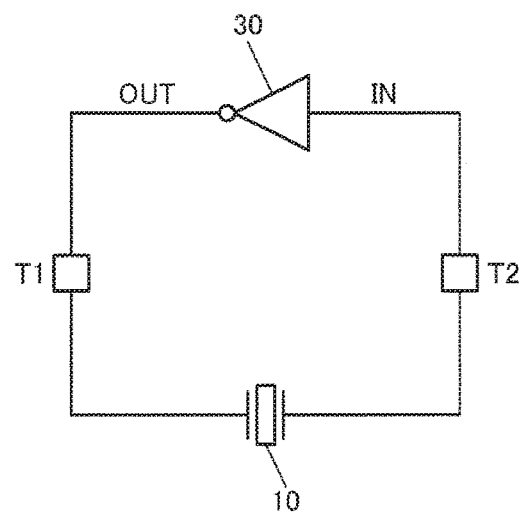
FIG. 3 is a diagram showing a configuration example of a drive circuit.

For example, the circuit device 20 drives the vibrator 10 using the output signal (a drive signal) of the drive circuit 30. For example, FIG. 3 shows a configuration example of the drive circuit 30. FIG. 3 shows the configuration example of the drive circuit 30 in the case in which the vibrator device 2 is an oscillator using the vibrator 10. In FIG. 3, the drive circuit 30 is realized by an inverting amplifier circuit (an inverter circuit), and the output signal OUT of the drive circuit 30 is output to the vibrator 10 (the electrode 12) via the terminal T1. Further, the input signal IN (a feedback signal) from the vibrator 10 (the electrode 13) is input to the drive circuit 30 via the terminal T2. Thus, it is possible to oscillate the vibrator 10 to thereby generate an oscillation signal (a clock signal) with a predetermined oscillation frequency. It should be noted that the drive circuit 30 is not limited to the configuration shown in FIG. 3, but can also be a drive circuit in a physical quantity measurement device such as a gyro sensor described later.

As shown in FIG. 2, the vibrator device 2 has a package formed of ceramic or the like. The package 3 has a housing space S in the inside thereof, and the vibrator 10 and the circuit device 20 are housed in the housing space S. The housing space S is airtightly sealed, and is set to a reduced-pressure state (desirably a state approximate to vacuum state). Due to the package 3, it is possible to protect the vibrator 10 and the circuit device 20 from an impact, dust, heat, moisture and so on in good condition. The package 3 has a base 4 and a lid 5. Specifically, the package 3 is constituted by the base 4 for supporting the vibrator 10 and the circuit device 20, and the lid 5 bonded on the upper surface of the base 4 so that the housing space S is formed between the base 4 and the lid 5.

As shown in the cross-sectional view of FIG. 2, the base 4 has a first recessed part opening in the upper surface and a second recessed part opening in the bottom surface of the first recessed part in the inside thereof. On the bottom surface of the first recessed part, there are disposed step parts 6, 7, and on the step parts 6, 7, there are formed internal terminals TI1, TI2 of the vibrator device 2, respectively. The internal terminals TI1, TI2 are electrically connected to external terminals TE1, TE2 of the vibrator device 2, respectively, via internal interconnections (not shown) of the package 3. The external terminals TE1, TE2 are formed on the outside bottom surface of the package 3. The external terminals TE1, TE2 are connected to an external device via external interconnections (e.g., interconnections of the circuit board). For example, the circuit device 20 is provided with the signal terminals TS1, TS2, and the signal terminals TS1, TS2 are respectively provided with conductive bumps BS1, BS2. Further, as shown in FIG. 2, the conductive bumps BS1, BS2 of the signal terminals TS1, TS2 are connected to the internal terminals TI1, TI2 of the vibrator device 2 so as to have contact with each other. Thus, the signal terminals TS1, TS2 of the circuit device 20 and the external terminals TE1, TE2 are made to electrically be connected to each other, respectively.

FIG. 1 is a plan view of the active surface AF of the circuit device 20 in the plan view thereof, and is a diagram viewed from, for example, an opposite direction to the direction DR1. In the plan view of the active surface AF, the terminals T1, T2 and T3 of the circuit device 20 are disposed so as to overlap the vibrator 10. As shown in the cross-sectional view (a diagram viewed from the direction DR3) of FIG. 2, the vibrator 10 and the circuit device 20 are attached in a stacked manner so as to be arranged in the thickness direction. A unit having the vibrator 10 and the circuit device attached in a stacked manner as described above will hereinafter be called a vibrator unit 9 (a stacked body).

As shown in FIG. 2, the terminals T1, T2 and T3 of the circuit device 20 are respectively provided with conductive bumps B1, B2 and B3 (connection bumps). The conductive bumps B1, B2 and B3 are projection-like connection electrodes respectively formed on the terminals T1, T2 and T3. The conductive bumps B1, B2 and B3 are each, for example, a metal bump (e.g., a gold bump, a silver bump or a copper bump) formed of metal. It should be noted that it is also possible to adopt a modified implementation in which a resin core bump formed by metal-plating a core of the bump formed of resin is used as the conductive bump.

Then, the terminal T1 is electrically connected to the electrode 12 of the vibrator 10 via the conductive bump B1. Specifically, as shown in FIG. 1 and FIG. 2, the vibrator 10 is provided with an interconnection 16 connected to the electrode 12 and a first connecting terminal not shown connected to the interconnection 16. Further, by the conductive bump B1 of the terminal T1 being connected to the first connecting terminal, the terminal T1 and the electrode 12 become to electrically be connected to each other via the conductive bump B1, the first connecting terminal and the interconnection 16. Further, the terminal T2 is electrically connected to the electrode 13 of the vibrator 10 via the conductive bump B2. Specifically, the vibrator 10 is provided with an interconnection 17 connected to the electrode 13 and a second connecting terminal not shown connected to the interconnection 17. In FIG. 1, the electrode 13 and the interconnection 17 are represented by dotted lines. Further, by the conductive bump B2 of the terminal T2 being connected to the second connecting terminal, the terminal T2 and the electrode 13 become to electrically be connected to each other via the conductive bump B2, the second connecting terminal and the interconnection 17. It should be noted that hereinabove, there is described the case in which the terminal T1 and the electrode 12 are electrically connected to each other, and the terminal T2 and the electrode 13 are electrically connected to each other, but the present embodiment is not limited thereto, and it is also possible for the terminal T1 and the electrode 13 to electrically be connected to each other, and it is also possible for the terminal T2 and the electrode 12 to electrically be connected to each other. For example, it is also possible for the electrode 13 to be the first electrode, and it is also possible for the electrode 12 to be the second electrode.

In contrast, the terminal T3 of the circuit device 20 is a dummy terminal not electrically connected to the electrodes 12, 13 of the vibrator 10. For example, the terminal T3 is provided with the conductive bump B3, and the conductive bump B3 has contact with the vibrator 10, but is not electrically connected to the electrodes 12, 13 of the vibrator 10. For example, the terminals T1, T2 of the circuit device 20 are connected to the first and second connecting terminals of the vibrator 10, but the terminal T3 is not connected to these first and second connecting terminals.

Figure 9:
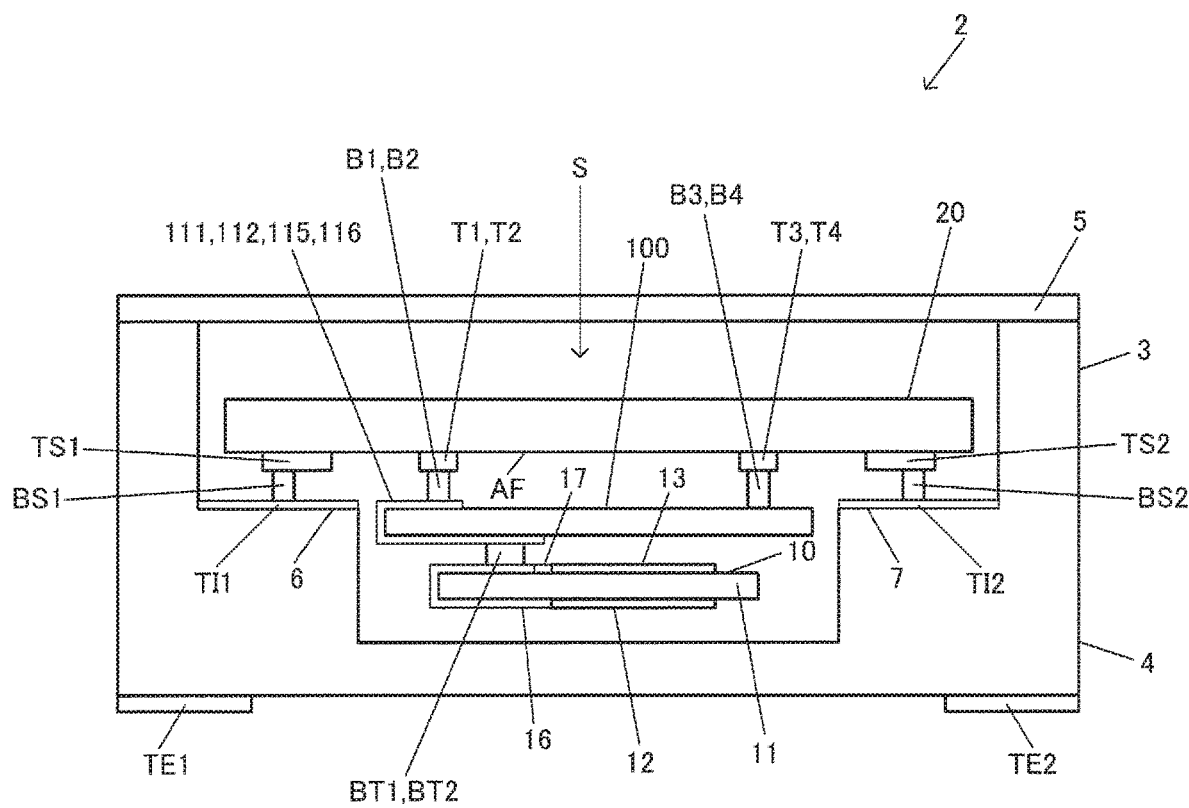
FIG. 9 is a cross-sectional view of the vibrator device of the detailed example.
Figure 9:
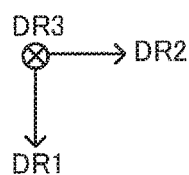
Figure 10:
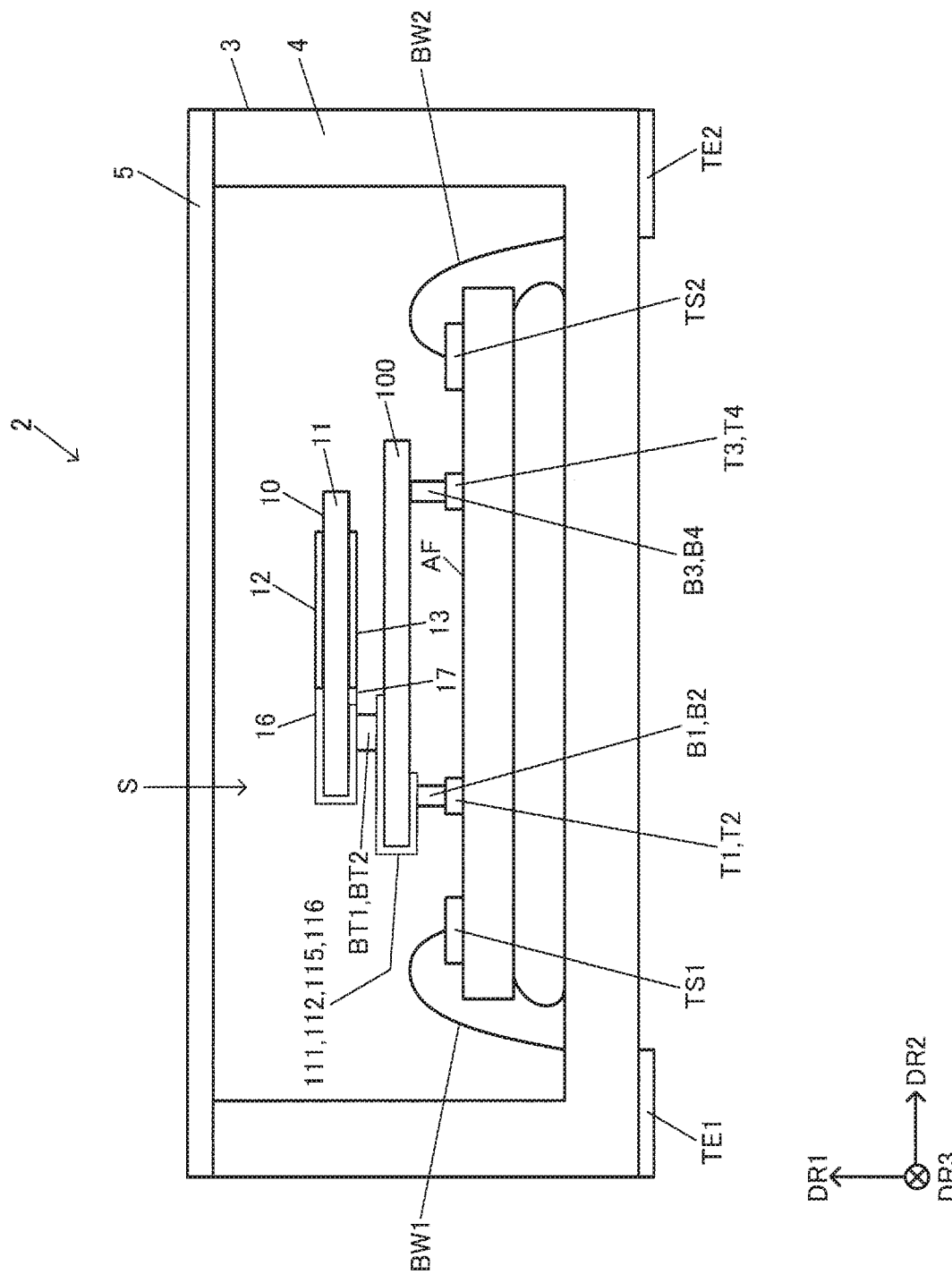
FIG. 10 is a cross-sectional view of the vibrator device of the detailed example.

Further, the vibrator 10 is supported on the active surface AF side of the circuit device 20 using the conductive bumps B1, B2 and B3 provided respectively to the terminals T1, T2 and T3. For example, the conductive bumps B1, B2 and B3 (and the terminals T1, T2 and T3) function as support members, and the vibrator 10 is supported (three-point supported) by the circuit device 20. For example, in FIG. 2, the vibrator 10 is supported by the circuit device 20, and is mounted face-down. It should be noted that it is also possible for the circuit device 20 to have a fourth terminal (at least one fourth terminal) not electrically connected to the electrodes 12, 13 of the vibrator 10. In this case, the vibrator 10 is arranged to be supported (four-point supported) by the circuit device 20 using the conductive bumps B1, B2 and B3 provided respectively to the terminals T1, T2 and T3, and a conductive bump provided to the fourth terminal as a result. Further, it is not required to directly be supported by the circuit device 20, and can also be supported indirectly via a relay substrate 100 as shown in FIG. 9, FIG. 10 and so on described later. Further, the number of the terminals of the circuit device for supporting the vibrator 10 can also be five or more.

As described above, the vibrator device 2 according to the present embodiment includes the vibrator 10 and the circuit device 20. Further, the circuit device 20 includes the drive circuit 30 for driving the vibrator 10, the terminal T1 which is electrically connected to the electrode 12 of the vibrator 10 and from which the output signal from the drive circuit 30 to the vibrator 10 is output, the terminal T2 which is electrically connected to the electrode 13 of the vibrator 10 and to which the input signal from the vibrator 10 to the drive circuit 30 is input, and the terminal T3 which is not electrically connected to the electrodes 12, 13 of the vibrator 10. Further, the terminals T1, T2 and T3 are respectively provided with the conductive bumps B1, B2 and B3 for supporting the vibrator 10 on the active surface AF side of the circuit device 20. As described above, in the vibrator device 2 and the circuit device 20 of the present embodiment, the terminals T1, T2 electrically connected to the electrodes of the vibrator 10 and the terminal T3 not electrically connected to the electrode of the vibrator 10 are provided to the circuit device 20, and the drive circuit 30 of the circuit device 20 drives the vibrator 10 via the terminals T1, T2. Further, the vibrator 10 is supported by the conductive bumps B1, B2 and B3 provided respectively to the terminals T1, T2 and T3 to be disposed on the active surface AF side of the circuit device 20. By adopting this configuration, it becomes possible to dispose and fix the vibrator 10 on the active surface AF side of the circuit device 20 without using, for example, a silicon series adhesive. Therefore, it becomes possible to suppress the temporal change of the vibration characteristics (e.g., the oscillation frequency) of the vibrator 10 and so on caused by the outgas and so on from the adhesive, and it becomes possible to obtain the better vibration characteristics. By using the conductive bumps B1, B2 and B3 such as metal bumps, the outgas from these bumps is prevented from occurring, and it is possible to effectively suppressing the environmental change (e.g., rise in pressure) in the housing space S to thereby improve the vibration characteristics. Citing the case in which the vibrator device 2 is an oscillator as an example, it is possible to keep the frequency error at a minimum, and it becomes possible to achieve an improvement in accuracy of the oscillation frequency. Further, by providing the terminal T3 in addition to the terminals T1, T2, it becomes possible to stably support the vibrator 10 on the circuit device 20. Specifically, there is a possibility that the support of the vibrator 10 only by the terminals T1, T2 for driving is not sufficient in view of the stability depending on the size and so on of the vibrator 10, but by further providing the dummy terminal T3 to adopt the three-point support (or, e.g., the four-point support) with the terminals T1, T2 and T3, the stable support becomes possible. As described above according to the present embodiment, it becomes possible to realize both of the improvement of the vibration characteristics of the vibrator 10 and the stable support of the vibrator 10. Further, in the vibrator unit 9 attached with the vibrator 10 and the circuit device 20, the terminals T1, T2 for driving of the circuit device 20 are electrically connected to the electrodes 12, 13 of the vibrator 10 to thereby realize the state in which the vibrator can be driven by the drive circuit 30. Therefore, it becomes possible to use the vibrator unit 9 for a variety of purposes such as an adjustment of the vibration characteristics of the vibrator 10 described later. Further, by supporting the vibrator with the conductive bumps B1, B2 and B3, it is possible to keep the distance between the vibrator 10 and the circuit device 20 at a minimum, and it becomes also possible to achieve the reduction in size of the vibrator device 2.

Further, in FIG. 1, two areas sectioned by the center line CL in the plan view of the active surface AF of the circuit device 20 are defined as areas AR1, AR2. The center line CL (middle line) is a center line for dividing any of the four sides forming the outline of, for example, the circuit device 20 into two equal parts, and is a center line for dividing the long side into two equal parts in the present embodiment. In this case, the terminals T1, T2 are disposed in the area AR1 (a first area) out of the areas AR1, AR2, and the terminal T3 is disposed in the area AR2 (a second area). Further, in the case of further providing the fourth terminal as a dummy, the fourth terminal is also arranged to be disposed in the area AR2. By adopting this configuration, it becomes possible to support the vibrator 10 with the support points (T1, T2 and T3) in the areas AR1, AR2 on both sides of the center line CL of the circuit device 20, and it is possible to realize the stable support of the vibrator 10 with the circuit device 20. It should be noted that in order to realize more stable support, it is desirable to dispose the terminals T1, T2 at positions as far to the left (one side) from the center line CL as possible, and dispose the terminal T3 at a position as far to the right (the other side) from the center line CL as possible in the area overlapping the vibrator 10 in the plan view of FIG. 1.

Further, as shown in FIG. 1, the drive circuit 30 of the circuit device 20 is disposed at a position nearer to the terminals T1, T2 compared to the position of the terminal T3. For example, in the case of defining the distance between the drive circuit 30 and the terminals T1, T2 as LD1, and the distance between the drive circuit 30 and the terminal T3 as LD2, LD1<LD2 is true. For example, in FIG. 1, by disposing the drive circuit 30 between the terminal T1 and the terminal T2, the distance between the terminals T1, T2 and the drive circuit 30 is made short. By adopting this configuration, it becomes possible to drive the vibrator 10 using the terminals T1, T2 disposed at the positions near to the drive circuit 30. Therefore, it is possible to reduce the influence of parasitic capacitances and parasitic resistances of the interconnections connected to the terminals T1, T2, and the appropriate drive of the vibrator 10 by the drive circuit 30 becomes possible. Thus, it is possible to improve the vibration characteristics of the vibrator 10, and citing the case in which the vibrator device 2 is an oscillator as an example, it is possible to keep the frequency error at a minimum, and it becomes possible to achieve an improvement in accuracy of the oscillation frequency. Further, by making the distance between the drive circuit 30 and the terminals T1, T2 shorter on the one hand, and making the distance between the drive circuit 30 and the terminal T3 longer on the other hand, it becomes possible to make the distance between the terminals T1, T2 and the terminal T3 longer as a result. Further, by making the distance between the terminals T1, T2 and the terminal T3 longer as described above, the stable support of the vibrator 10 by the conductive bumps B1, B2 and B3 of the terminals T1, T2 and T3 becomes possible.

2. Detailed Example of Vibrator Device

Then, a detailed example of the vibrator device 2 will be described. Here, the description will be presented citing the case in which the vibrator device 2 is an oscillator as an example. Specifically, an application example to the temperature-compensated crystal oscillator (TCXO) as a temperature-compensated oscillator will be described. It should be noted that the temperature-compensated oscillator can also be the oven-controlled crystal oscillator (OCXO).

Figure 4:
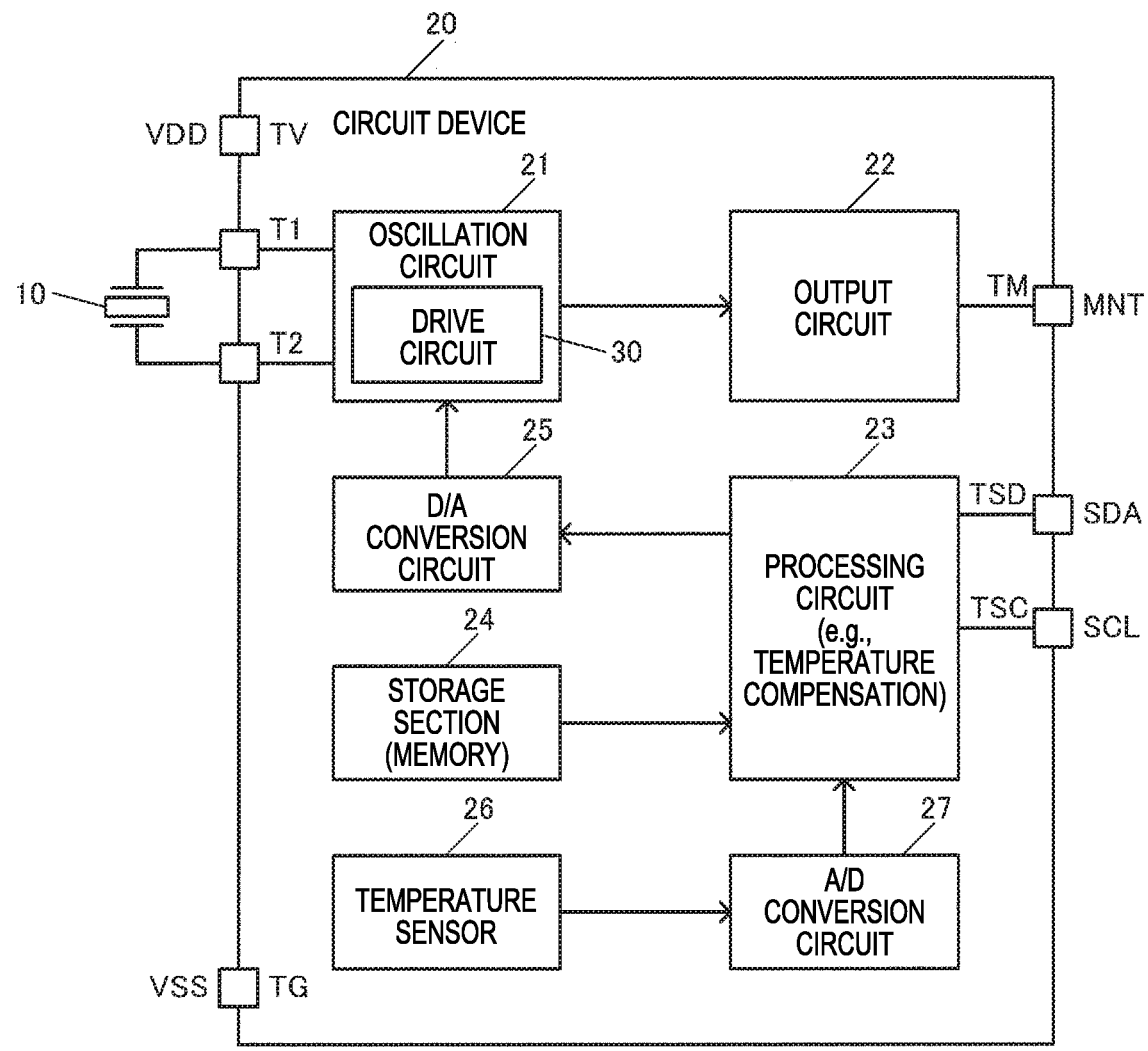
FIG. 4 is a diagram showing a configuration example of a circuit device.
Figure 5:
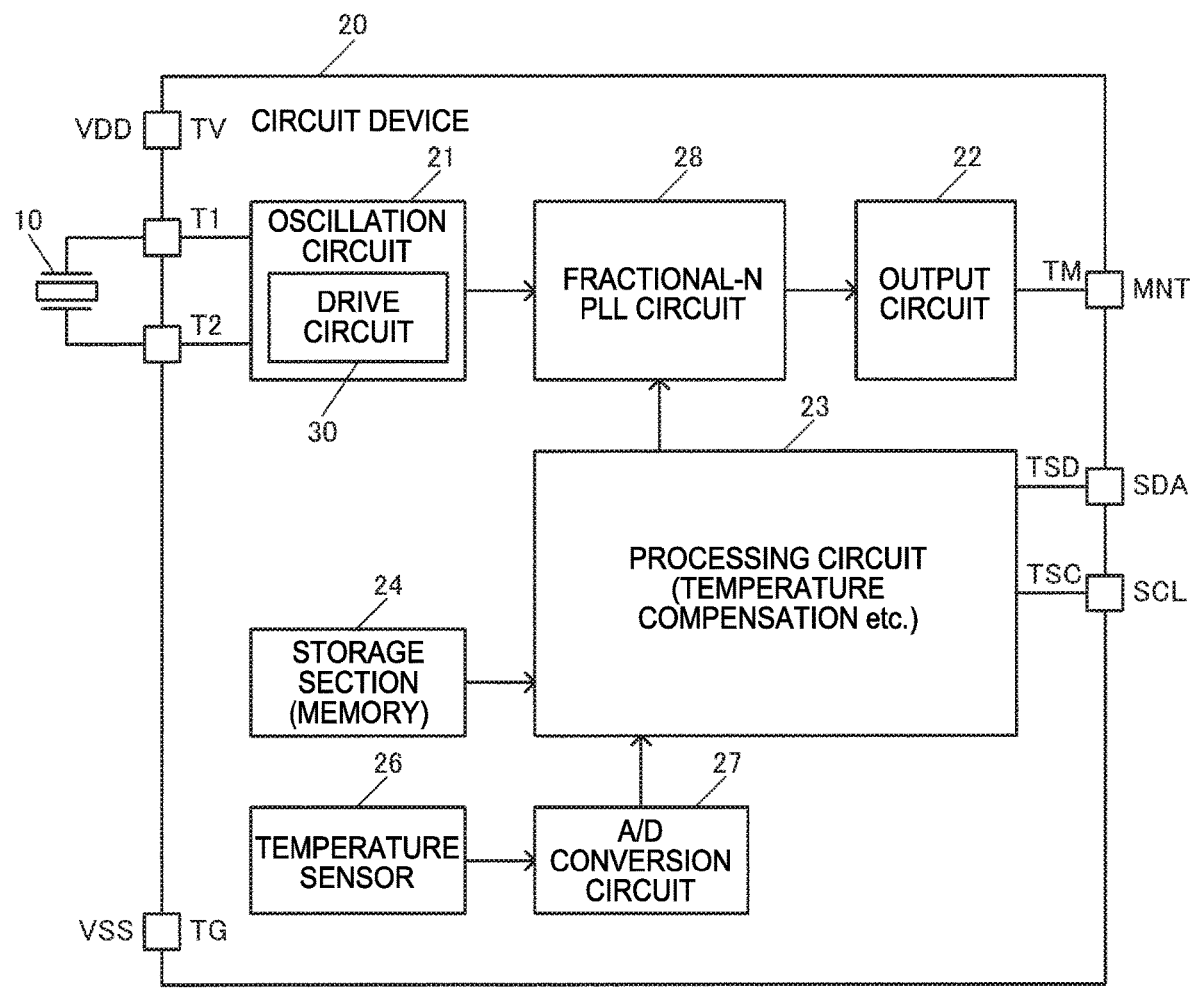
FIG. 5 is a diagram showing a configuration example of the circuit device.

FIG. 4 and FIG. 5 show a configuration example of the circuit device 20 in the detailed example of the vibrator device 2. In FIG. 4, the circuit device 20 includes an oscillation circuit 21, and output circuit 22, the terminals T1, T2 and a monitor terminal TM. Further, the circuit device 20 can further include a processing circuit 23, a storage section 24 (a memory), a D/A conversion circuit 25, a temperature sensor 26, an A/D conversion circuit 27, power supply terminals TV, TG, and signal terminals TSD, TSC.

The oscillation circuit 21 is a circuit having the drive circuit 30 to drive the vibrator 10 with the drive circuit 30 to thereby oscillate the vibrator 10. As the oscillation circuit 21, it is possible to adopt a circuit having such a configuration as shown in FIG. 3. It should be noted that it is desirable to provide a variable capacitance circuit to at least one connection node out of an output node and an input node of the drive circuit 30 shown in FIG. 3. The variable capacitance circuit can be realized by, for example, a varactor having the capacitance value varying based on a control voltage, or a capacitor array in which the number of capacitors connected to the connection node is switched based on digital control data.

The output circuit 22 outputs a monitor signal MNT corresponding to the vibration characteristics of the vibrator 10 while the vibrator 10 is driven by the drive circuit 30 via the terminals T1, T2. The output circuit 22 can be realized by, for example, a buffer circuit for buffering a signal. The monitor terminal TM is a terminal from which the monitor signal MNT from the output circuit 22 is output. For example, the output circuit 22 outputs the monitor signal MNT based on the signal from the oscillator circuit 21. For example, the oscillator circuit 21 outputs a clock signal with the oscillation frequency of the vibrator 10. The output circuit 22 buffers, for example, the clock signal as the output signal from the oscillation circuit 21, and then outputs the result to the monitor terminal TM as the monitor signal MNT. In other words, the output circuit 22 outputs the monitor signal MNT based on the signal (the clock signal) from the oscillator circuit 21. Then, an external measurement device (a tester) measures the oscillation frequency based on the monitor signal MNT (the clock signal) output from the monitor terminal MT. Thus, it becomes possible to monitor the oscillation frequency as the vibration characteristics of the vibrator 10.

The temperature sensor 26 outputs a temperature-dependent voltage varying in accordance with the temperature of the environment (e.g., the circuit device 20 and the vibrator 10) as a temperature detection voltage. For example, the temperature sensor 26 generates the temperature-dependent voltage using a circuit element having temperature dependency, and then outputs the temperature-dependent voltage with reference to a voltage (e.g., a bandgap reference voltage) independent of the temperature. For example, the temperature sensor 26 outputs a forward voltage of a PN-junction as the temperature-dependent voltage.

The A/D conversion circuit 27 performs A/D conversion of the temperature detection voltage from the temperature sensor 26 to output the result as temperature detection data. As the A/D conversion method, it is possible to adopt, for example, a successive approximation type, a flash type, a pipeline type, or a double integral type.

The processing circuit 23 (a digital signal processing circuit) performs a variety of types of signal processing. For example, the processing circuit 23 (a temperature compensation section) performs a temperature compensation process for compensating the temperature characteristic of the oscillation frequency of the vibrator 10 based on the temperature detection data, and then outputs frequency control data for controlling the oscillation frequency. Specifically, the processing circuit 23 performs the temperature compensation process for canceling or suppressing (making the oscillation frequency constant even in the case in which the temperature variation occurs) the fluctuation of the oscillation frequency due to the temperature variation based on the temperature detection data (temperature-dependent data) varying in accordance with the temperature, coefficient data (data of coefficients of an approximation function) for the temperature compensation process, and so on. The coefficient data for the temperature compensation process is stored in the storage section 24. The storage section 24 can be realized by a semiconductor memory such as RAM (e.g., SRAM, DRAM), or can also be realized by a nonvolatile memory. The processing circuit 23 can be realized by a digital signal processor (DSP) for performing a variety of types of signal processing including the temperature compensation process in a time-sharing manner. Alternatively, the processing circuit 23 can also be realized by an ASIC circuit with automated layout/wiring such as a gate array, or realized by a processor (e.g., a CPU or an MPU) and a program running on the processor. Further, it is also possible for the processing circuit 23 to perform other correction processes (e.g., an aging correction) than the temperature compensation process. Further, it is also possible for the processing circuit 23 to perform heater control (oven control) of a constant-temperature oven in the oven-controlled oscillator (OCXO), and so on.

It should be noted that the processing circuit 23 has an interface circuit for performing serial communication with an external device using a clock signal SCL and a data signal SDA. The interface circuit is an interface circuit compliant with, for example, $I^2C$ or SPI. Signal terminals TSC, TSD are terminals for the clock signal SCL and the data signal SDA. For example, the signal terminals TS1, TS2 shown in FIG. 1 and FIG. 2, and in FIG. 7 described later correspond to such signal terminals TSC, TSD.

The D/A conversion circuit 25 performs D/A conversion on the frequency control data to output a control voltage corresponding to the frequency control data to the oscillation circuit 21. The variable capacitance circuit provided to the oscillation circuit 21 is variably controlled in capacitance value based on the control voltage. The variable capacitance circuit in this case can be realized by the varactor described above or the like.

The power supply terminal TV is supplied with power VDD on the high potential side, and the power supply terminal TG is supplied with the power VSS (e.g., GND) on the low potential side. The circuit device 20 operates with the power VDD, VSS supplied.

FIG. 5 shows another configuration example of the circuit device 20. In FIG. 5, a fractional-N PLL circuit 28 is provided instead of the D/A conversion circuit 25 shown in FIG. 4. By setting the frequency division ratio in the fractional-N PLL circuit 28 based on the frequency control data from the processing circuit 23, the clock signal with the oscillation frequency corresponding to the frequency control data is generated by the fractional-N PLL circuit 28. Then, the clock signal thus generated is buffered by the output circuit 22, and is then output to the outside as the monitor signal MNT via the monitor terminal TM. Then, the external measurement device measures the oscillation frequency based on the monitor signal MNT output from the monitor terminal MT. Thus, it becomes possible to monitor the oscillation frequency as the vibration characteristics of the vibrator 10.

Figure 6:
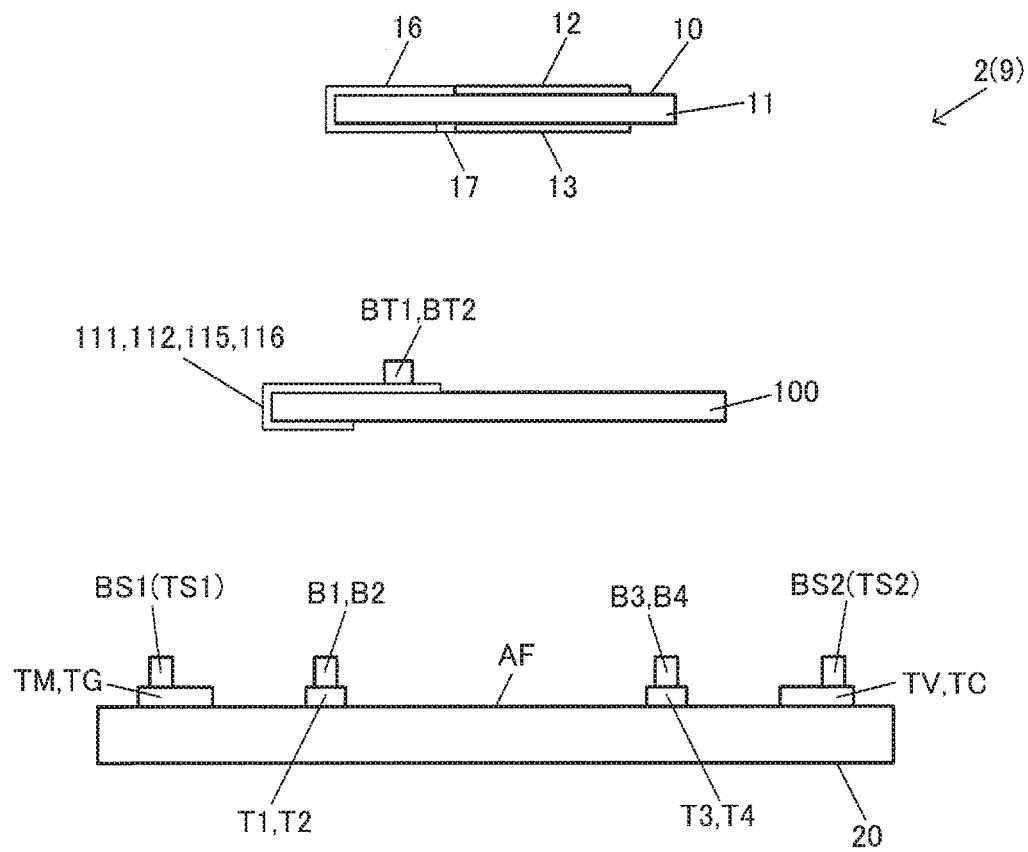
FIG. 6 is an explanatory diagram of the vibrator device of a detailed example.
Figure 7:
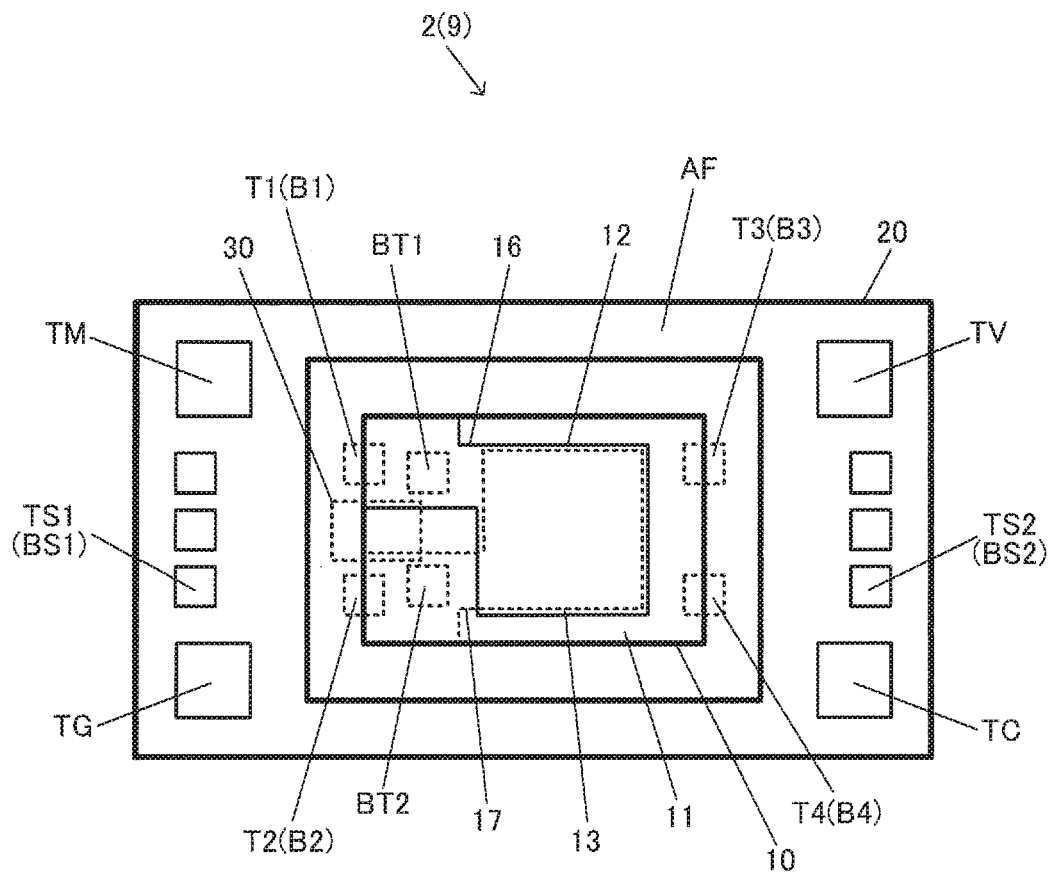
FIG. 7 is a plan view of the vibrator device of the detailed example.
Figure 8:
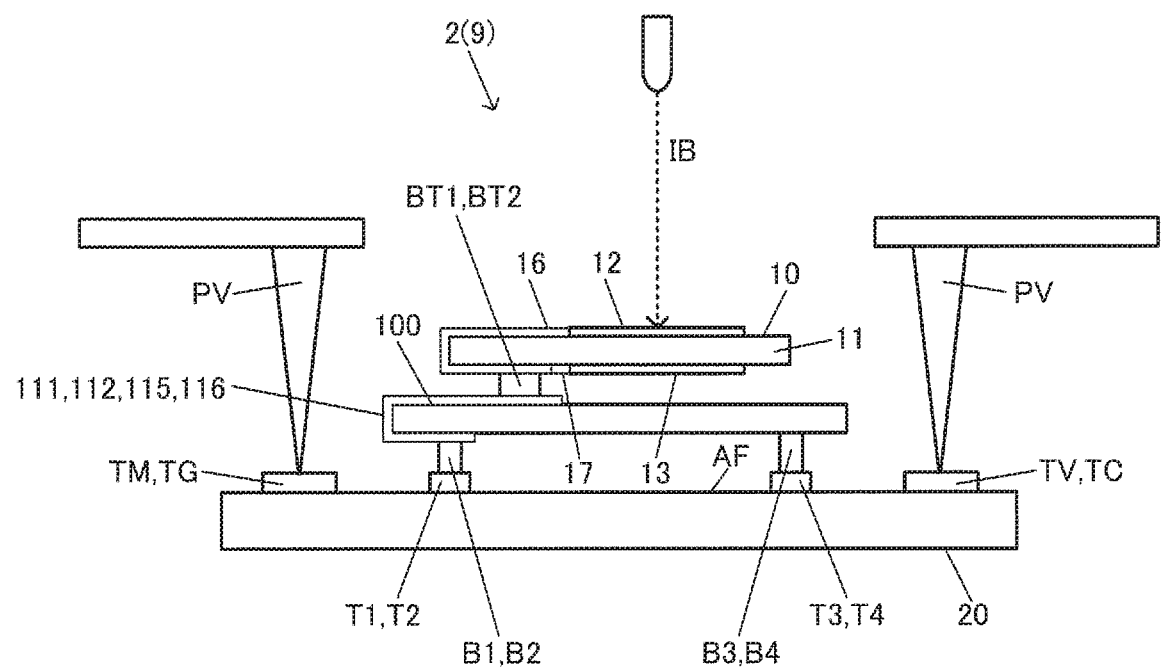
FIG. 8 is an explanatory diagram of a method of adjusting vibration characteristics of the vibrator device of the detailed example.
Figure 8:
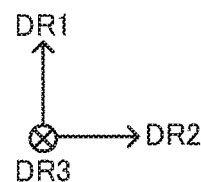

FIG. 6, FIG. 7 and FIG. 8 are explanatory diagrams of the vibrator device 2 of the detailed example. FIG. 9 and FIG. 10 are cross-sectional views showing the vibrator device 2 in the state of being installed in the package 3. As shown in FIG. 6, in the vibrator device 2 of the detailed example, a relay substrate 100 is disposed between the vibrator 10 and the circuit device 20. For example, the vibrator 10, the relay substrate 100 and the circuit device 20 are attached in a stacked manner so as to be arranged in the thickness direction. A unit having the vibrator 10, the relay substrate 100 and the circuit device 20 attached in a stacked manner as described above forms the vibrator unit 9 (the stacked body). As explained in detail with reference to FIG. 15 described later, the relay substrate 100 is provided with interconnections 111, 112 for electrically connecting the terminal T1 of the circuit device 20 and the electrode 12 of the vibrator 10 to each other, and interconnections 115, 116 for electrically connecting the terminal T2 of the circuit device 20 and the electrode 13 of the vibrator 10 to each other. These interconnections 111, 112, 115 and 116 are electrically connected to terminals 14, 15 of the vibrator 10 shown in FIG. 15 described later via the conductive bumps BT1, BT2 disposed on the surface facing the vibrator 10 of the relay substrate 100. Then, the terminals 14, 15 of the vibrator 10 are electrically connected to the electrodes 12, 13, respectively. Specifically, as shown in detail in FIG. 15, the terminal 14 (a first connecting terminal) is connected to the electrode 12 via the interconnection 16, and the terminal 15 (a second connecting terminal) is connected to the electrode 13 via the interconnection 17. Thus, the terminals T1, T2 for driving of the circuit device 20 are arranged to electrically be connected to the electrodes 12, 13 of the vibrator 10, respectively. Further, by applying the drive voltage between the terminals T1, T2, the vibrator 10 is arranged to perform the oscillation action. As described above, the relay substrate 100 is a substrate for relaying the electrical connection between the vibrator 10 and the circuit device 20. The relay substrate 100 has a function of making the stress generated by deformation of the circuit device 20 and the package 3 difficult to reach the vibrator 10. The relay substrate 100 can be realized by, for example, a quartz crystal substrate. By patterning, for example, the quartz crystal substrate by etching (e.g., wet etching), the relay substrate 100 having such a shape as shown in, for example, FIG. 15 described later is formed. It should be noted that it is also possible to realize the relay substrate 100 using a piezoelectric substrate other than the quartz crystal substrate, a silicon substrate, a resin substrate, a metal substrate, a ceramic substrate, or the like.

Further, in the vibrator device 2 of the detailed example shown in FIG. 6 through FIG. 10, the circuit device 20 includes the terminal 13, T4 (the third and fourth terminals) not electrically connected to the electrodes 12, 13 (the first and second electrodes) of the vibrator 10. Further, the vibrator 10 is supported on the active surface AF side of the circuit device 20 using the conductive bumps B1, B2, B3 and B4 provided respectively to the terminals T1, T2, T3 and T4. Specifically, the vibrator 10 is supported on the active surface AF side of the circuit device 20 via the relay substrate 100 supported by the conductive bumps B1, B2, B3 and B4 of the respective terminals T1, T2, T3 and T4 of the circuit device 20. Further, similarly to FIG. 1, the terminals T1, T2 are disposed in the area AR1 sectioned by the center line CL of the circuit device 20, and the terminals T3, T4 are disposed in the area AR2. Further, the drive circuit 30 is disposed at a position near to the terminals T1, T2 compared to the terminals T3, T4. It should be noted that although the four terminals T1, T2, T3 and T4 are used here as the terminals for supporting the vibrator 10, it is also possible to arranged that the vibrator 10 is supported using the three terminals T1, T2 and T3 as shown in FIG. 1 and FIG. 3. Alternatively, it is also possible to arrange that the vibrator 10 is supported using five or more terminals.

As described above, in the present embodiment, the relay substrate is made to intervene between the vibrator 10 and the circuit device 20. By making the relay substrate 100 intervene in such a manner, the deformation (stress) due to, for example, the thermal deflection of the circuit device 20 and the package 3 becomes difficult to reach the vibrator 10, and it becomes possible to suppress the deterioration of the vibration characteristics of the vibrator 10.

Further, in the present embodiment, the terminals T1, T2 for driving to electrically be connected to the electrodes 12, 13 of the vibrator 10, and the dummy terminals T3, T4 not electrically connected to these terminals 12, 13 are provided to the circuit device 20. Further, the vibrator 10 is supported by the circuit device 20 using the conductive bumps B1, B2, B3 and B4 provided respectively to the terminals T1, T2, T3 and T4. The vibrator 10 is supported by the circuit device 20 via, for example, the relay substrate 100. By adopting such a configuration, it becomes possible to achieve the four-point support of the vibrator 10 with the conductive bumps B1, B2, B3 and B4, and thus, the more stable support of the vibrator 10 becomes possible. Therefore, it becomes possible to realize both of the improvement of the vibration characteristics and the stable support.

FIG. 7 is a diagram in a plan view of the active surface AF of the circuit device 20. As shown in FIG. 4 and FIG. 5, the circuit device 20 has the output circuit 22 for outputting the monitor signal MNT corresponding to the vibration characteristics of the vibrator 10, and the monitor terminal TM from which the monitor signal MNT from the output circuit 22 is output. The terminals T1, T2 are electrically connected to the electrodes 12, 13 of the vibrator 10, and at the same time, electrically connected to the drive circuit 30. As shown in, for example, FIG. 3, the output signal OUT from the drive circuit 30 to the vibrator 10 is output from the terminal T1, and the input signal IN from the vibrator 10 to the drive circuit 30 is input to the terminal T2. Therefore, it is possible for the output circuit 22 to output the monitor signal MNT, which is for monitoring the vibration characteristics of the vibrator 10 while the vibrator 10 is driven by the drive circuit 30 via the terminals T1, T2, to the monitor terminal TM. Further, as shown in FIG. 7, the monitor terminal TM is disposed at a position not overlapping the vibrator 10 in a plan view of the active surface AF of the circuit device 20. More specifically, the monitor terminal TM is disposed at a position not overlapping the relay substrate 100 in the plan view. For example, the terminals T1, T2, T3 and T4 are disposed at positions overlapping the vibrator 10 and the relay substrate 100 in the plan view, but the monitor terminal TM is disposed at a position not overlapping the vibrator 10 or the relay substrate 100. Similarly, the power supply terminals TG, TV for supplying the power and the control terminal TC described later are also disposed at positions not overlapping the vibrator 10 or the relay substrate 100 in the plan view. It should be noted that as shown in FIG. 6 through FIG. 10, in the configuration in which the vibrator 10 is supported by the circuit device 20 via the relay substrate 100, the monitor terminal TM (TG, TV and TC) is disposed at a position not overlapping the relay substrate 100 in the plan view. In contrast, as shown in FIG. 1 and FIG. 2, in the configuration in which the vibrator 10 is directly supported by the circuit device 20 without providing the relay substrate 100, the monitor terminal TM (TG, TV and TC) is disposed at a position not overlapping the vibrator 10 in the plan view.

By disposing the monitor terminal TM at such a position, it becomes easy to press a probe PV against the monitor terminal TM as shown in FIG. 8. Then, it becomes possible to easily measure the monitor signal MNT with the external measurement device (the tester).

It should be noted that it is also possible to adopt a configuration in which, for example, a monitoring pad is provided to the relay substrate 100, and is electrically connected to the monitor terminal TM. By adopting such a configuration, even in the configuration in which the monitor terminal TM overlaps the relay substrate 100 and the vibrator 10 in the plan view, by pressing the probe PV against the monitoring pad of the relay substrate 100, the monitor signal MNT can easily be measured.

Specifically, in FIG. 8, the electrode 12 as an excitation electrode of the vibrator 10 is irradiated with an ion beam IB. By performing the irradiation with the ion beam IB in such a manner to remove (thin the film thickness) a part of the electrode 12, it is possible to adjust the oscillation frequency (resonant frequency) as the vibration characteristics of the vibrator 10. In, for example, FIG. 9 and FIG. 10, the vibrator 10 and the circuit device 20 are installed in the state of being housed by the package 3, but in FIG. 8, the irradiation with the ion beam IB is performed in an adjustment process as a manufacturing process prior to housing the vibrator 10 and the circuit device 20 in the package 3 to thereby adjust the oscillation frequency. In this case, the vibrator 10 is supported by the circuit device 20 using the conductive bumps B1 through B4 of the terminals T1 through T4, and there is provided the state in which the vibrator 10 and the circuit device 20 are attached. Further, the terminals T1, T2 to be connected to the drive circuit 30 are electrically connected to the electrodes 12, 13, and it is possible to drive the vibrator 10 by the drive circuit 30. Further, by pressing the probe PV against the power supply terminals TV, TG to supply the power VDD, VSS from the external device (e.g., a power supply device), the circuit device 20 is supplied with the power VDD, VSS, and thus, the circuit device 20 can operate. Therefore, it becomes possible for the external measurement device to measure the oscillation frequency (the vibration characteristics) of the vibrator 10 while the vibrator 10 is driven by the drive circuit 30 via the terminals T1, T2 using the monitor signal MNT (the clock signal).

Specifically, the monitor signal MNT is a signal representing the vibration characteristics varying by the adjustment in the case in which the vibrator 10 is processed to adjust the vibration characteristics. In FIG. 8, for example, the electrode 12 of the vibrator 10 is irradiated with the ion beam IB to thereby be processed, and thus, the oscillation frequency (the resonance frequency) as the vibration characteristics is adjusted. In this case, by pressing the probe PV against the monitor terminal TM, it becomes possible to monitor the oscillation frequency (the vibration characteristics in a broad sense) varied by the adjustment due to the irradiation with the ion beam IB using the monitor signal MNT from the monitor terminal TM. When a part of the electrode 12 is removed by, for example, the irradiation with the ion beam IB, the oscillation frequency of the vibrator 10 varies, and thus, the frequency of the clock signal as the monitor signal MNT also varies. Therefore, by measuring the variation of the frequency using the external measurement device, it becomes possible to adjust the oscillation frequency of the vibrator 10 to an appropriate frequency.

In particular, in the present embodiment, in the state in which the vibrator 10 and the circuit device 20 are attached, and the vibrator 10 is actually driven by the drive circuit 30, it is possible to measure the frequency using the monitor signal MNT while adjusting the oscillation frequency with the ion beam IB. Therefore, since it is possible to measure the frequency while driving the vibrator 10 in the same state as in the case of the actual product, a more appropriate adjustment of the oscillation frequency becomes possible. Further, when performing the irradiation with the ion beam IB, the relay substrate 100 and so on function as a mask, and it is also possible to prevent the case in which the circuit device 20 is irradiated with the ion beam IB. Therefore, the damage of the circuit device 20 by the ion beam IB can be reduced.

Figure 11:
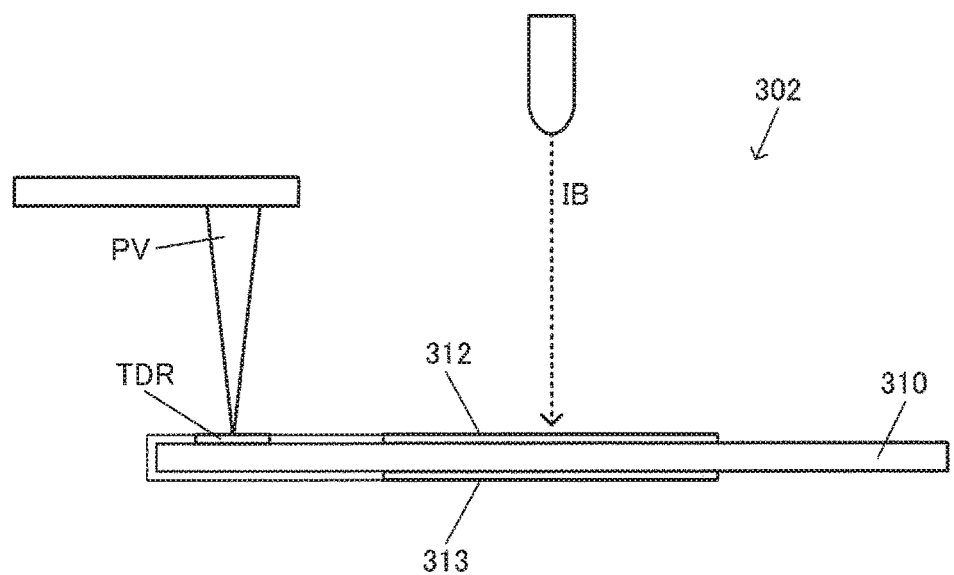
FIG. 11 is an explanatory diagram of a method of adjusting vibration characteristics of a comparative example.
Figure 12:
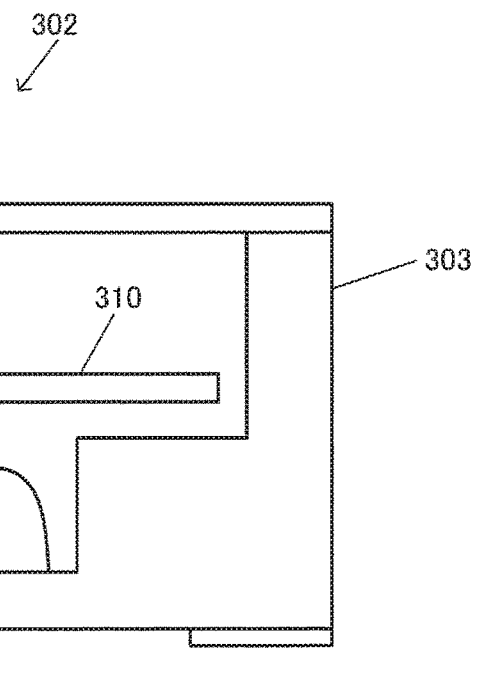
FIG. 12 is an explanatory diagram of the method of adjusting the vibration characteristics of the comparative example.

For example, FIG. 11 and FIG. 12 are diagrams for explaining an adjustment method of vibration characteristics of a vibrator device 302 of a comparative example. In FIG. 11, in the state in which a vibrator 310 having electrodes 312, 313 is kept alone, the probe PV is applied to a terminal TDR to input the drive signal of the vibrator 310, and the electrode 312 is irradiated with the ion beam IB to adjust the oscillation frequency (the resonance frequency) of the vibrator 310. Then, after the adjustment process, the vibrator 310 and a circuit device 320 are housed in a package 303 as shown in FIG. 12, and then the vibrator device 302 is shipped as a product. In this case, before shipping, for example, a final fine adjustment of the oscillation frequency of the vibrator 310 is performed using an adjustment function of the circuit device 320.

However, in the method shown in FIG. 11 and FIG. 12, the vibrator 310 and the circuit device 320 are not attached, and the frequency adjustment with the ion beam IB is performed in the state in which the vibrator 310 is kept alone. Therefore, it results in the case in which the frequency adjustment with the ion beam IB is performed in the different state from the state of the actual product. Therefore, there is a disadvantage that the appropriate frequency adjustment cannot be realized.

In contrast, in the present embodiment, as shown in FIG. 8, it is possible to perform the frequency adjustment with the ion beam IB in substantially the same state as the state of the actual product in which the vibrator 10 and the circuit device 20 are attached, and the vibrator 10 is driven by the drive circuit 30. For example, it is possible to perform the frequency adjustment reflecting the parasitic resistances and the parasitic capacitances of the interconnections connected to the drive circuit 30. Therefore, it becomes possible to keep the frequency error at a minimum to achieve an improvement in accuracy of the oscillation frequency. Specifically, in the present embodiment, the oscillation frequency of the vibrator 10 is adjusted with the ion beam IB in the state in which the vibrator 10 and the circuit device 20 are attached as shown in FIG. 8. Subsequently, as shown in FIG. 9 and FIG. 10, the vibrator 10 and the circuit device 20 are housed and installed in the package 3 to be set to the state of the product. Then, the capacitance value of the variable capacitance circuit of the drive circuit 30 described above is adjusted using, for example, the external terminals TE1, TE2 of the vibrator device 2 to thereby perform the final frequency adjustment. For example, external terminals to be connected to the signal terminals TSC, TSD of the clock signal SCL and the data signal SDA shown in FIG. 4 and FIG. 5 are prepared as the external terminals TE1, TE2, and the adjustment process of the capacitance value of the variable capacitance circuit is performed using these external terminals. In this case, since the frequency adjustment with the ion beam IB has been performed in the state in which the vibrator 10 and the circuit device 20 are attached as shown in FIG. 8, the adjustment range in the case of the final frequency adjustment using the capacitance value of the variable capacitance circuit can be made extremely narrow, and the frequency accuracy can dramatically be improved as a result. For example, it becomes possible to realize such a vibrator device 2 as to have, for example, the frequency accuracy equal to or finer than several tens of ppb (desirably equal to or finer than about 10 ppb). Further, in the present embodiment, it is possible to adjust and then measure the frequency before housing the vibrator 10 and the circuit device 20 in the package 3. Therefore, it is also possible to prevent the occurrence of the case in which the oscillation frequency of the vibrator 10 becomes out-of-specification, both of the circuit device 20 and the package 3 are wasted, and thus, the manufacturing cost increases.

For example, as the communication method between the base station and the communication terminal, there has been used the frequency division duplex (FDD), but the time division duplex (TDD) is used in the communication method such as 5G the next-generation method. Further, in the TDD system, data is transmitted and received in a time division manner using the same frequency between the uplink and the downlink, and the guard time is set between the time slots assigned to the respective devices. Therefore, in order to realize the appropriate communication, it is necessary to perform the time synchronization in each device, and timing of accurate absolute time is required. Further, in the case of using the oscillator as a reference signal source, there is a problem of so-called hold-over. For example, by synchronizing the oscillation signal (the output signal) of the oscillator with the reference signal from the GPS or the network using the PLL circuit, it becomes possible to suppress the frequency variation. However, if the hold-over, in which the reference signal from the GPS or the network (the Internet) disappears or becomes abnormal, occurs, it becomes unachievable to obtain the reference signal for the synchronization. Therefore, in the case in which such hold-over has occurred, it is necessary for the oscillator side to measure the absolute time in the state in which no reference signal exists, and if the measured time becomes incorrect, the communication becomes failed. Therefore, extremely high frequency stability is required for the oscillator even in the hold-over period.

Meanwhile, there is a problem that the oscillation frequency of the oscillator varies due to aging. The cause of the variation in the oscillation frequency due to the aging is said to be attachment and detachment of powder dust to and from the vibrator occurring inside, for example, an airtightly sealed container, an environmental variation due to outgas, or an aging deterioration of the adhesive used in the oscillator. Therefore, in order to realize such an oscillator as to be able to deal with the next-generation communication method, it is necessary to realize the oscillation frequency high in accuracy and suppressed in such variation due to aging.

In this regard, according to the method of the present embodiment, since the attachment of the vibrator 10 and the circuit device 20 is performed using the conductive bumps B1 through B4 without using an adhesive or the like, the variation of the oscillation frequency due to aging can be suppressed. Further, it is possible to perform the frequency adjustment using the ion beam IB in the state in which the vibrator 10 and the circuit device 20 are attached as shown in FIG. 8. Therefore, it becomes possible to realize the oscillation frequency so high in accuracy as to be able to deal with the next-generation communication method (e.g., the accuracy with which the hold-over time is 1.5 μs).

Further, as shown in FIG. 7, the area of the monitor terminal TM is larger than the area of each of the terminals T1 through T4. For example, the area of the monitor terminal TM is more than double the area of each of the terminals T1 through T4, and is more preferably more than four times. For example, in the case in which the area of each of the terminals T1 through T4 is 100 μm×100 μm, the area of the monitor terminal TM is set to more than double of 100 μm×100 μm, or set to more than four times (more than 200 μm×200 μm) of 100 μm×100 μm. It should be noted that in the case in which just three terminals T1 through T3 are provided as in the case of FIG. 1, the area of the monitor terminal TM is set larger than the area of each of the terminals T1 through T3 (the first through third terminals). By making the area of the monitor terminal TM larger as described above, it becomes easy to apply the probe PV to the monitor terminal TM when performing the frequency adjustment as shown in FIG. 8, and it becomes possible to improve the work efficiency and so on of the frequency adjustment.

For example, in the case of performing the frequency adjustment using a jig 120 shown in FIG. 16 described later, the area of the tip of each of the probes (PV1 through PV4) provided to the jig 120 becomes large. Therefore, if the area of the terminal to which the probe is applied is small, there occurs the case in which it becomes impossible to make the tip of the probe have appropriate contact with the terminal. In this regard, in FIG. 7 and FIG. 8, the area of the monitor terminal TM to which the probe is applied is made larger than the area of a standard terminal. Therefore, even in the case of using the jig 120 shown in FIG. 16, it becomes possible to apply the probe of the jig 120 to the monitor terminal TM, and it is possible to achieve an improvement of the work efficiency and so on of the frequency adjustment. Further, since the contact area between the probe and the monitor terminal TM is made larger, even in the case in which the frequency of the clock signal as the monitor signal MNT is high, it becomes also possible to appropriately transfer the monitor signal MNT to the measurement device for the frequency adjustment.

Further, as shown in FIG. 7, the monitor terminal TM is disposed in one of four corner regions of the circuit device 20. For example, in FIG. 7, the monitor terminal TM is disposed in the corner region located on the upper left side of the circuit device 20. The corner region is a region having a predetermined area and set with respect to an intersection (a corner part) where two of the sides of the circuit device 20 cross each other. By disposing the monitor terminal TM in the corner region as described above, in the case of, for example, supporting the circuit device 20 by the probe applied to the terminal, it becomes possible to stably support the circuit device 20 with the probe.

More specifically, the circuit device 20 includes the power supply terminal TV (a first power supply terminal) supplied with VDD as the high potential side power when monitoring the vibration characteristics of the vibrator 10 as shown in FIG. 8, and the power supply terminal TG (a second power supply terminal) supplied with VSS (GND) as the low potential side power when monitoring the vibration characteristics thereof. The circuit device 20 operates based on VDD, VSS supplied to the power supply terminals TV, TG in the measurement (in a frequency adjustment process) by monitoring the vibration characteristics of the vibrator 10. In other words, each of the circuits of the circuit device 20 operates using VDD, VSS supplied respectively to the power supply terminals TV, TG as operation power. Further, as shown in FIG. 7, the power supply terminals TV, TG are disposed in other corner regions than the one corner region provided with the monitor terminal TM out of the four corner regions. In FIG. 7, the monitor terminal TM is disposed in the corner region located on, for example, the upper left side, the power supply terminal TV is disposed in the corner region located on, for example, the upper right side, and the power supply terminal TG is disposed in the corner region located on, for example, the lower left side. Further, the circuit device 20 is provided with the control terminal TC to which the control signal is input, and the control terminal TC is disposed in the corner region located on, for example, the lower right side. As the control signal input to the control terminal TC, for example, a control signal for enabling the output of the monitor signal MNT can be assumed. It should be noted that the layout of the monitor terminal TM, the power supply terminals TV, TG and the control terminal TC is not limited to the layout shown in FIG. 7, but a variety of modified implementations can be adopted. For example, it is also possible to dispose the monitor terminal TM, the power supply terminals TV, TG and the control terminal TC in different corner regions from those shown in FIG. 7.

If the monitor terminal TM, the power supply terminals TV, TG and the control terminal TC are disposed in the corner regions of the circuit device 20 as shown in FIG. 7, in the case of supporting the circuit device 20 by the probes applied to the terminal, it becomes possible to stably support the circuit device 20 with the probes. For example, the stable support of the circuit device 20 using the four-point support (the three-point support in the case of the three terminals) becomes possible. In the case of using, for example, the jig 120 shown in FIG. 16, it becomes possible to stably support the circuit device 20 by the probes PV1, PV2, PV3 and PV4 applied respectively to the monitor terminal TM, the power supply terminals TV, TG and the control terminal TC. Further, it is possible to irradiate the electrode 12 (the excitation electrode) of the vibrator 10 with the ion beam IB as shown in FIG. 8 in the state of supporting the circuit device 20 by the probes PV1 through PV4 as described above. Thus, it becomes possible to perform the adjustment of the oscillation frequency with the ion beam IB while monitoring the oscillation frequency of the vibrator 10 using the monitor signal MNT (the clock signal).

It should be noted that in FIG. 8, the electrode 12 of the vibrator 10 is irradiated with the ion beam IB to partially be removed to thereby perform the frequency adjustment. In contrast, regarding the electrode 13 of the vibrator 10, it is sufficient to perform the frequency adjustment using the ion beam or the like in the state of a wafer before clipping, for example, the vibrator 10. A wafer shaped like a thin plate made of, for example, an AT-cut quartz crystal plate is prepared, and by performing patterning the wafer by etching (e.g., dry etching or wet etching), a plurality of vibrator elements (vibrating substrates) is formed in the wafer. Then, a metal film is grown on the surfaces of the vibrator elements to thereby form the electrodes (12, 13) on each of the vibrator elements. Then, in the process prior to cutting (separating) the vibrator elements from the wafer, the electrode (the electrode 13) of each of the vibrator elements in the wafer is irradiated with the ion beam to thereby perform the frequency adjustment. The frequency adjustment is performed while measuring, for example, the resonance frequency. By adopting the configuration described above, it becomes possible to process the electrodes 12, 13 in a balanced manner, and it is possible to realize a more appropriate frequency adjustment.

Further, as shown in FIG. 7, the circuit device 20 has the signal terminals TS1, TS2. As the signal terminals TS1, TS2, for example, the signal terminal TSC for the clock signal SCL and the signal terminal TSD for the data signal SDA as shown in FIG. 4 and FIG. 5 and so on can be assumed. Further, the signal terminals TS1, TS2 are disposed at positions not overlapping the vibrator 10 in a plan view of the active surface AF of the circuit device 20. Specifically, in FIG. 7, the signal terminals TS1, TS2 are disposed at positions not overlapping the relay substrate 100 in the plan view. For example, in FIG. 7, the terminals T1 through T4 are disposed at positions overlapping the relay substrate 100 and the vibrator 10 in the plan view. In contrast, in addition to the monitor terminal TM, the power supply terminals TV, TG and the control terminal TC, the signal terminals TS1, TS2 are also disposed at positions not overlapping the relay substrate 100 or the vibrator 10 in the plan view. By adopting the configuration described above, it becomes possible to easily realize the electrical connection between the signal terminals TS1, TS2 and the external terminals TE1, TE2 of the vibrator device 2.

For example, FIG. 9 and FIG. 10 each show a cross-sectional view in the side view of the vibrator device 2 of the detailed example. FIG. 9 shows an example of face-down mounting, and FIG. 10 shows an example of face-up mounting.

For example, in FIG. 9, the circuit device 20 is mounted face-down to the package 3 of the vibrator device 2. Specifically, the face-down mounting is performed so that the active surface AF of the circuit device 20 faces to the base (a bottom surface) of the package 3. For example, in the case of defining the direction from the circuit device 20 toward the vibrator 10 as DR1, the circuit device 20 is mounted so that the direction DR1 faces to the base 4 (the bottom surface) of the package 3. Then, in the state in which the relay substrate 100 and the vibrator 10 are attached to the circuit device 20, the circuit device 20, the relay substrate 100 and the vibrator 10 are housed in the housing space S of the package 3, and the housing space S is airtightly sealed.

In this case, the conductive bumps BS1, BS2 respectively formed on the signal terminals TS1, TS2 of the circuit device 20 are connected respectively to the internal terminals TI1, TI2 formed in the step parts 6, 7 (the bottom part of the first recessed part) of the base 4. Then, the internal terminals TI1, TI2 are electrically connected to the external terminals TE1, TE2 via, for example, the internal interconnections of the package 3, respectively. Therefore, by performing the face-down mounting as shown in FIG. 9, it becomes possible to electrically connect the signal terminals TS1, TS2 and the external terminals TE1, TE2 of the vibrator device 2 to each other, respectively. For example, as shown in FIG. 7, the signal terminals TS1, TS2 of the circuit device 20 are disposed at positions not overlapping the vibrator 10 or the relay substrate 100 in the plan view. Therefore, in the case of performing the face-down mounting as shown in FIG. 9, it is possible to easily connect the conductive bumps BS1, BS2 of the signal terminals TS1, TS2 to the internal terminals TI1, TI2 on the step parts 6, 7, respectively. Therefore, since the signal terminals TS1, TS2 are disposed at the positions not overlapping the vibrator 10 or the relay substrate 100 in the plan view, the vibrator 10 and the relay substrate 100 are out of the way in the case of connecting the conductive bumps BS1, BS2 of the signal terminals TS1, TS2 to the internal terminals TI1, TI2, respectively, in the face-down mounting. Therefore, it becomes possible to easily connect the conductive bumps BS1, BS2 of the signal terminals TS1, TS2 to the internal terminals TI1, TI2, respectively, and it becomes possible to electrically connect the signal terminals TS1, TS2 of the circuit device 20 and the external terminals TE1, TE2 of the vibrator device 2 to each other, respectively.

In contrast, in FIG. 10, the circuit device 20 is mounted face-up to the package 3 of the vibrator device 2. Specifically, the face-up mounting is performed so that the active surface AF of the circuit device 20 faces to the lid 5 (an upper surface) of the package 3. For example, in the case of defining the direction from the circuit device 20 toward the vibrator 10 as DR1, the circuit device 20 is mounted so that the direction DR1 faces to the lid 5 (the upper surface) of the package 3. An underfill is disposed below the circuit device 20. Then, in the state in which the relay substrate 100 and the vibrator 10 are attached to the circuit device 20, the circuit device 20, the relay substrate 100 and the vibrator 10 are housed in the housing space S of the package 3, and the housing space S is airtightly sealed.

In this case, by connecting bonding wires BW1, BW2 to the signal terminals TS1, TS2 of the circuit device 20, it becomes possible to electrically connect the signal terminals TS1, TS2 and the external terminals TE1, TE2 to each other, respectively. Thus, it becomes possible to input a signal from the outside to the circuit device 20, or to output a signal from the circuit device 20 to the outside via the external terminals TE1, TE2, the internal terminals TI1, TI2 and the signal terminals TS1, TS2, respectively. For example, the signal terminals TS1, TS2 of the circuit device 20 are disposed at positions not overlapping the vibrator 10 or the relay substrate 100 in the plan view. Therefore, in the case of performing the face-up mounting as shown in FIG. 10, the vibrator 10 and the relay substrate 100 do not act as obstacles to the bonding connection of the bonding wires BW1, BW2. Therefore, it becomes possible to easily connect the bonding wires BW1, BW2 to the signal terminals TS1, TS2, and it is possible to electrically connect the signal terminals TS1, TS2 and the external terminals TE1, TE2 to each other, respectively.

Figure 13:
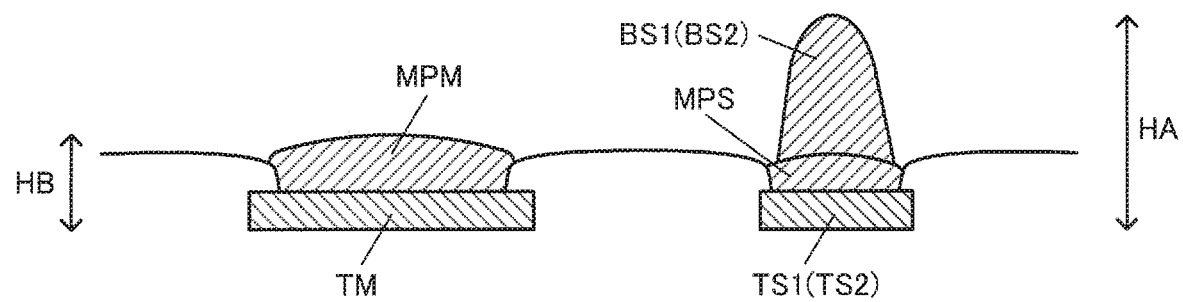
FIG. 13 is an explanatory diagram regarding a relationship in height between a monitor terminal and a signal terminal.

Further, in the present embodiment, the height of the signal terminals TS1, TS2 in the cross-sectional view is made higher than the height of the monitor terminal TM (TV, TG and TC) in the cross-sectional view. In FIG. 13, for example, a multilayer plating MPS (metal layer for connection) for connection is formed above the signal terminal TS1 (TS2), and the conductive bump BS1 (BS2) as a metal bump is formed above the plating MPS. As the multilayer plating MPS, it is possible to use, for example, Ni/Pd/Au, and as the conductive bump BS1, it is possible to use an Au bump or the like. By forming the plating MPS between the signal terminal TS1 and the conductive bump BS1 as described above, it is possible to enhance the connection strength. Further, the height in the cross-sectional view of the signal terminal TS1 (TS2) provided with the plating MPS and the conductive bump BS1 is defined as HA. In other words, the height HA in this case includes not only the height of pad metal of the signal terminal TS1 (TS2), but also the height of the plating MPS and the conductive bump BS1.

In contrast, above the monitor terminal TM, there is formed a multilayer plating MPM alone. In other words, the multilayer plating MPM is formed above the pad metal of the monitor terminal TM. As the multilayer plating MPM, it is possible to use Ni/Pd/Au or the like. The height in the cross-sectional view of the monitor terminal TM provided with the plating MPM as described above is defined as HB. In other words, the height HB in this case includes not only the height of the pad metal of the monitor terminal TM, but also the height of the plating MPM.

As described above, by making the height HA in the cross-sectional view of the signal terminals TS1, TS2 higher, it becomes possible to easily connect the conductive bumps BS1, BS2 of the signal terminals TS1, TS2 to the internal terminals TI1, TI2 on the step parts 6, 7 of the base 4 when performing such face-down mounting as shown in FIG. 9, for example. Specifically, in the case of performing such face-down mounting, the height HB of the monitor terminal TM (TV, TG and TC) is lower, and therefore the monitor terminal TM does not have contact with the step parts 6, 7 or the internal terminals TI1, TI2 on the one hand, but the height HA of the signal terminals TS1, TS2 is higher, and therefore, the conductive bumps BS1, BS2 become to have contact with the internal terminals TI1, TI2, on the other hand. Therefore, it becomes possible to stably connect the conductive bumps BS1, BS2 of the signal terminals TS1, TS2 to the internal terminals TI1, TI2, respectively, and it becomes also possible to achieve, for example, reduction of the parasitic resistance in the connection.

Figure 14:
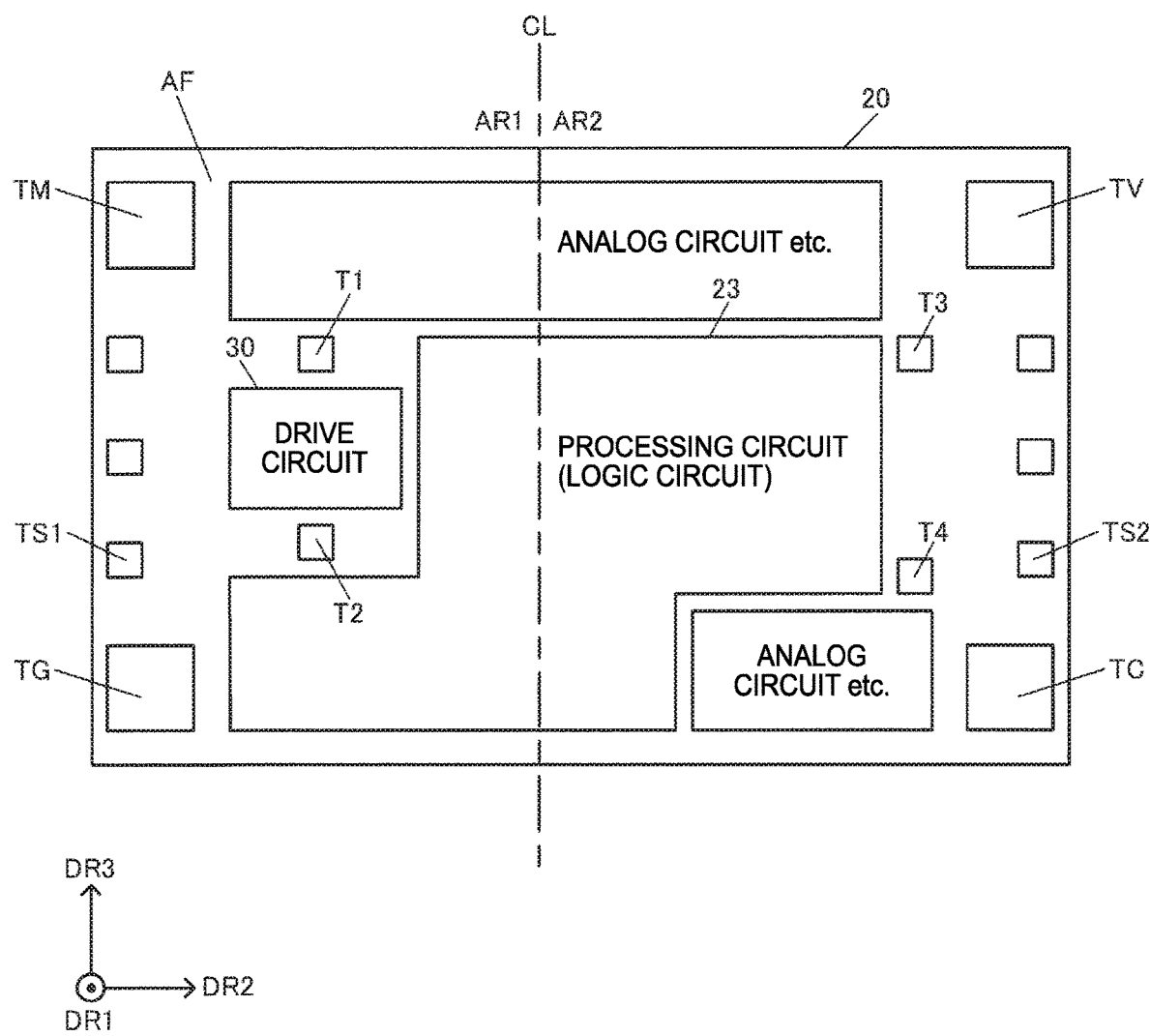
FIG. 14 is a diagram showing a layout arrangement example of the circuit device.

FIG. 14 shows a detailed layout arrangement example of the circuit device 20. Among the areas AR1, AR2 sectioned by the center line CL in the plan view of the active surface AF of the circuit device 20 shown in FIG. 14, the terminals T1, T2 are disposed in the area AR1, and the terminals T3, T4 are disposed in the area AR2. The terminals T3, T4 are each a dummy terminal (pad) to which the electrode of the vibrator 10 or the circuit of the circuit device 20 is not connected. For example, the terminal T3 is disposed at a position roughly line-symmetrical with the terminal T1 about the center line CL. The terminal T4 is disposed at a position roughly line-symmetrical with the terminal T2 about the center line CL. It should be noted that the layout of the terminals T1 through T4 is not limited to such a line-symmetrical layout. Further, the drive circuit 30 is disposed between the terminals T1, T2 in FIG. 14, but the present embodiment is not limited thereto. It is also possible to adopt a variety of modified implementations such as disposing the terminals T1, T2 on the left hand side (on the side in the direction toward the short side of the circuit device 20, on the opposite side to the direction DR2) of the drive circuit 30.

The monitor terminal TM, the power supply terminals TV, TG and the control terminal TC are disposed in the respective corner regions of the circuit device 20. Further, for example, the signal terminal TS1 is disposed in a terminal area (an I/O area) between the monitor terminal TM and the power supply terminal TG, and the signal terminal TS2 is disposed in a terminal area (an I/O area) between the power supply terminal TV and the control terminal TC. For example, the monitor terminal TM and the power supply terminal TG are disposed along a first short side of the circuit device 20, and the power supply terminal TV and the control terminal TC are disposed along a second short side opposed to the first short side of the circuit device 20.

Further, in a terminal area between the monitor terminal TM and the power supply terminal TG, there is disposed a power supply terminal to which the power VSS is supplied in the normal operation (in the operation as a product) instead of the monitor operation. This power supply terminal is electrically connected to, for example, the power supply terminal TG. Further, this power supply terminal is electrically connected to the external terminal of the vibrator device 2 via an internal terminal and an internal interconnection of the vibrator device 2. Further, in a terminal area between the power supply terminal TV and e control terminal TC, there is disposed a power supply terminal to which the power VDD is supplied in the normal operation. This power supply terminal is electrically connected to, for example, the power supply terminal TV. Further, this power supply terminal is electrically connected to the external terminal of the vibrator device 2 via an internal terminal and an internal interconnection of the vibrator device 2.

Around the center of the circuit device 20, there is disposed the processing circuit 23. The processing circuit 23 is realized by automated layout/wiring such as a gate array. It should be noted that it is also possible for the processing circuit 23 to include, for example, a macro block of a digital signal processor (DSP). Further, in other circuit areas than the processing circuit 23, there are disposed an analog circuit and so on. Specifically, there are disposed the circuits such as the D/A conversion circuit 25, the temperature sensor 26, the A/D conversion circuit 27, the fractional-N PLL circuit 28, and output circuit 22 and the storage section shown in FIG. 4 and FIG. 5.

Figure 15:
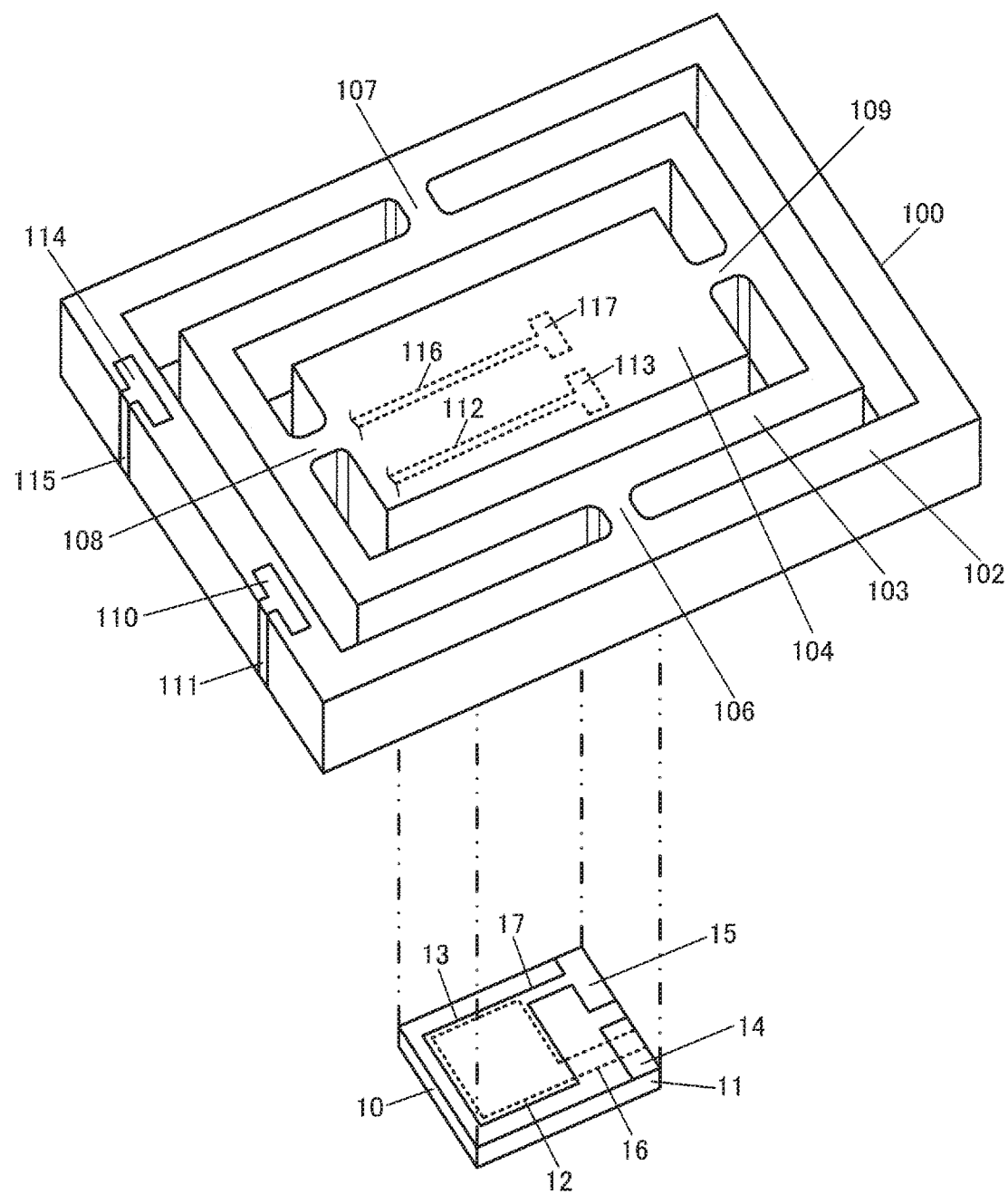
FIG. 15 is a perspective view of a detailed example of a relay substrate and a vibrator.

FIG. 15 shows a specific example of the relay substrate 100. The relay substrate 100 has a so-called gimbal shape, and has hole section (at least one hole sections) for stress relaxation opening in the plan view of the relay substrate 100 having a plate-like shape. Specifically, the relay substrate 100 has a support section 102 having a frame shape to be fixed to the circuit device 20, a first rocking section 103 having a frame shape located inside the support section 102, a second rocking section 104 located inside the first rocking section 103 and fixed to the vibrator 10, beam parts 106, 107 for connecting the support section 102 and the first rocking section 103 to each other, and beam parts 108, 109 for connecting the first rocking section 103 and the second rocking section 104 to each other.

The support section 102 has a rectangular frame shape. Further, as described with reference to FIG. 6 through FIG. 10, the support section 102 is fixed to the circuit device 20 due to the connection using the conductive bumps B1 through B4 provided respectively to the terminals T1 through T4 of the circuit device 20 and having conductivity. For example, the conductive bumps B1, B2 of the terminals T1, T2 are connected and fixed to terminals 110, 114 of the support section 102 of the relay substrate 100 shown in FIG. 15. The terminals T3, T4 are connected and fixed to places opposed to the terminals 110, 114 in the support section 102. By fixing the both sides of the support section 102 of the relay substrate 100 to the circuit device 20 in such a manner, the posture of the relay substrate 100 is stabilized, and it is possible to suppress unwanted displacement, vibration and so on of the relay substrate 100.

Further, the first rocking section 103 located inside the support section 102 and the second rocking section 104 located inside the first rocking section 103 are each provided with a rectangular plate-like shape. Further, as described with reference to FIG. 6 through FIG. 10, the vibrator 10 is fixed due to the connection using the conductive bumps BT1, BT2 formed respectively on the lower surface of the second rocking section 104 and having conductivity.

Further, the beam parts 106, 107 are located on both sides of the first rocking section 103, and connect the first rocking section 103 and the support section 102 to each other so as to support the first rocking section 103 on both sides. Thus, the first rocking section 103 is arranged to be able to rock around a line segment connecting the beam parts 106, 107 to each other with respect to the support section 102. Further, the beam parts 108, 109 are located on both sides of the second rocking section 104, and connect the second rocking section 104 and the first rocking section 103 to each other so as to support the second rocking section 104 on both sides. Thus, the second rocking section 104 is arranged to be able to rock around a line segment connecting the beam parts 108, 109 to each other with respect to the first rocking section 103.

According to the relay substrate 100 having such a configuration, since the transmission path of the stress from the support section 102 fixed to the circuit device 20 to the second rocking section 104 to which the vibrator 10 is fixed can be made meandering, it is possible to make the transmission path as long as possible. Thus, the stress caused by the deformation of the package 3 and the circuit device 20 is effectively absorbed and relaxed on the path from the support section 102 to the second rocking section 104, and it is possible to effectively prevent the stress from reaching the vibrator 10 fixed to the second rocking section 104. Therefore, it is difficult for the variation (fluctuation of the oscillation frequency) of the drive characteristics of the vibrator 10 to occur, and the vibrator 10 can exert the excellent vibration characteristics.

Further, as shown in FIG. 15, the support section 102 of the relay substrate 100 is provided with the terminals 110, 114. As described above, the terminals 110, 114 are connected respectively to the conductive bumps B1, B2 provided respectively to the terminals T1, T2 of the circuit device 20. Further, the terminal 110 is electrically connected to a terminal 113 disposed on the bottom surface of the second rocking section 104 via the interconnections 111, 112 provided to the relay substrate 100. The terminal 114 is electrically connected to a terminal 117 disposed on the bottom surface of the second rocking section 104 via the interconnections 115, 116 provided to the relay substrate 100. Further, the terminal 113, 117 are connected to the terminals 14, 15 of the vibrator 10 using the conductive bumps BT1, BT2, respectively. The terminals 14, 15 are connected to the electrodes 12, 13 as the excitation electrodes of the vibrator 10 via the interconnections 16, 17, respectively. By adopting such a configuration, the terminal T1 of the circuit device 20 becomes to electrically be connected to the electrode 12 of the vibrator 10 via the conductive bump B1, and the terminal 110, the interconnections 111, 112, the terminal 113, and the conductive bump BT1 of the relay substrate 100, and the terminal 14 and the interconnection 16 of the vibrator 10. Further, the terminal T2 of the circuit device 20 becomes to electrically be connected to the electrode 13 of the vibrator 10 via the conductive bump B2, and the terminal 114, the interconnections 115, 116, the terminal 117, and the conductive bump BT2 of the relay substrate 100, and the terminal 15 and the interconnection 17 of the vibrator 10. Thus, it becomes possible to vibrate the vibrator 10 by driving the electrodes 12, 13 of the vibrator 10 using the drive circuit 30 of the circuit device 20 connected to the terminals T1, T2.

Figure 16:
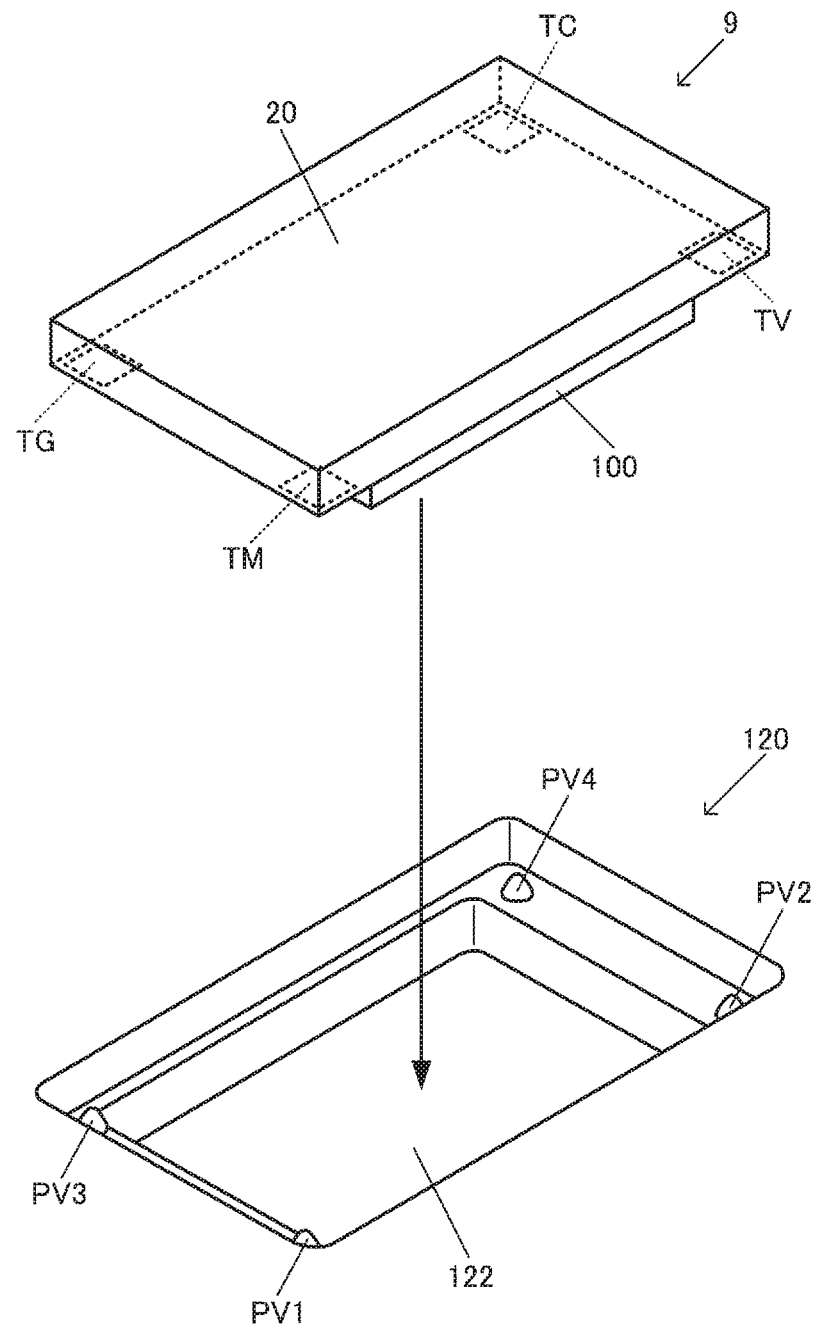
FIG. 16 is an explanatory diagram of a jig used for an adjustment of the vibration characteristics of the vibrator.

FIG. 16 is an explanatory diagram of the jig 120 used in the frequency adjustment process shown in FIG. 8. The frequency adjustment process shown in FIG. 8 is performed in the state in which the vibrator unit 9 having the circuit device 20, the relay substrate 100 and the vibrator 10 are stacked on one another is mounted on the jig 120. The jig 120 has the probes PV1, PV2, PV3 and PV4, and when mounting the vibrator unit 9 on the jig 120, the probes PV1, PV2, PV3 and PV4 of the jig 120 have contact with the respective terminals TM, TV, TG and TC of the circuit device 20. Further, the jig 120 has an opening section 122 for avoiding contact with the relay substrate 100 and the vibrator 10. By using such a jig 120, it becomes possible to input the monitor signal MNT output from the monitor terminal TM of the circuit device 20 to the measurement device via the probe PV1 to be used for monitoring the vibration characteristics when adjusting the vibration characteristics of the vibrator 10. Further, it becomes possible to supply the power VDD, VSS to the power terminals TV, TG of the circuit device 20 via the probes PV2, PV3, respectively, to thereby operate the circuit device 20 when adjusting the vibration characteristics of the vibrator 10. Further, it becomes possible to input the control signal to the control terminal TC of the circuit device 20 via the probe PV4 to thereby perform the control of the circuit device 20. It should be noted that since the monitor terminal TM, the power supply terminals TV, TG and the control terminal TC are disposed at the positions not overlapping the relay substrate 100 or the vibrator 10 in the plan view of the active surface AF of the circuit device 20, there is formed the structure in which it is easy to make the probes PV1, PV2, PV3 and PV4 have contact with the monitor terminal TM, the power supply terminals TV, TG and the control terminal TC, respectively.

In such a manner, the vibrator unit 9 having the circuit device 20, the relay substrate 100 and the vibrator 10 stacked on one another is mounted on the jig 120, and then the electrode 12 of the vibrator 10 is irradiated with the ion beam IB as described with reference to FIG. 8. Thus, the adjustment of the vibration characteristics such as the oscillation frequency of the vibrator 10 becomes possible. In this case, the vibrator unit 9 is set to the state in which the terminals T1, T2 of the circuit device 20 are electrically connected to the electrodes 12, 13 of the vibrator 10. Therefore, it is possible for the measurement device to obtain the monitor signal MNT from the monitor terminal TM of the circuit device 20 via the probe PV1 in the state in which the vibrator 10 is driven by the drive circuit 30 of the circuit device 20. Further, it becomes possible to adjust the vibration characteristics such as the oscillation frequency of the vibrator 10 with the ion beam IB while monitoring the variation of the vibration characteristics of the vibrator 10 using the monitor signal MNT.

Figure 17:
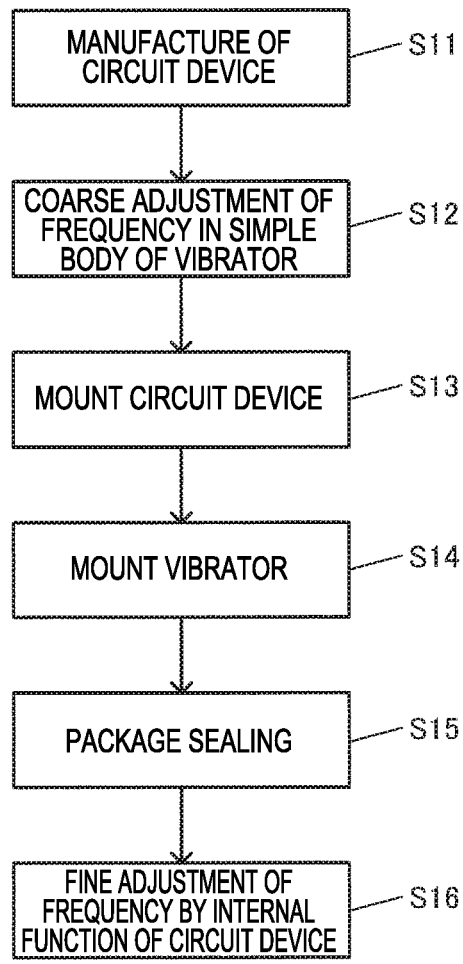
FIG. 17 is a flowchart for explaining a method of manufacturing a vibrator device according to a comparative example.

Then, a method of manufacturing the vibrator device 2 will be described. For example, FIG. 17 is a flowchart for explaining a method of manufacturing the vibrator device 302 in the comparative example shown in FIG. 11 and FIG. 12. Firstly, manufacture of the circuit device 320 is performed (step S11). Then, as described with reference to FIG. 11, a coarse adjustment of the frequency in the simple body of the vibrator 310 is performed (step S12). Then, the circuit device 320 is mounted (step S13), and then the vibrator 310 is mounted (step S14). Then, as shown in FIG. 12, package sealing is performed (step S15). Lastly, a frequency fine adjustment with the internal function of the circuit device 320 is performed (step S16).

Figure 18:
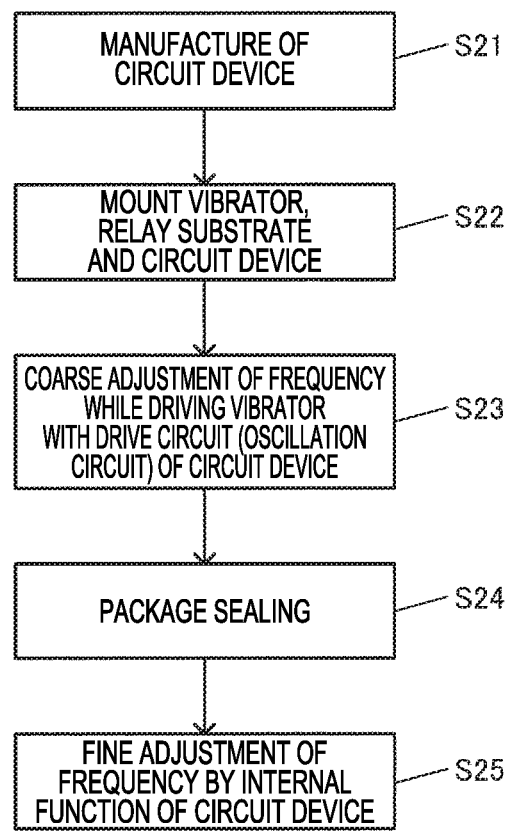
FIG. 18 is a flowchart for explaining a method of manufacturing the vibrator device according to the embodiment.

FIG. 18 is a flowchart for explaining a method of manufacturing the vibrator device 2 in the present embodiment. Firstly, manufacture of the circuit device 20 is performed (step S21). Specifically, in the present manufacturing process, there is manufactured the circuit device 20 having the drive circuit 30 for driving the vibrator 10, the terminal T1 from which the output signal from the drive circuit 30 to the vibrator 10 is output, the terminal T2 to which the input signal from the vibrator 10 to the drive circuit 30 is input, and the terminal T3. Specifically, the circuit device 20 is manufactured by manufacturing the semiconductor wafer provided with circuit patterns (patterns of transistors and signal lines) of a plurality of circuit devices 20 each having such a configuration, and then separating the circuit device 20 as an IC chip from the semiconductor wafer by cutting. The vibrator 10 and the relay substrate 100 are also manufactured by preparing a wafer having a thin plate shape formed of a quartz crystal plate or the like, and then patterning the wafer by etching.

Then, the vibrator 10, the relay substrate 100 and the circuit device 20 are mounted (step S22). Specifically, in the present mounting process, the vibrator 10 and the circuit device 20 are disposed so that the terminal T1 of the circuit device 20 and the electrode 12 of the vibrator 10 are electrically connected to each other, the terminal T2 of the circuit device 20 and the electrode 13 of the vibrator 10 are electrically connected to each other, and the vibrator 10 is supported on the active surface AF side of the circuit device using the conductive bumps B1, B2 and B3 provided respectively to the terminals T1, T2 and T3. Thus, as described with reference to FIG. 6 and FIG. 7, the vibrator unit 9 attached with the vibrator 10, the relay substrate 100 and the circuit device 20 is formed.

Then, the coarse adjustment of the frequency is performed (step S23) while driving the vibrator 10 with the drive circuit 30 (the oscillation circuit 21) of the circuit device 20. In other words, as described with reference to FIG. 8, in the state in which the vibrator 10 is driven by the drive circuit 30 of the circuit device 20, the coarse adjustment of the frequency is performed by irradiating the electrode 12 with the ion beam IB while monitoring the monitor signal MNT using the monitor terminal TM. Then, the package sealing is performed (step S24). Specifically, as described with reference to FIG. 9 and FIG. 10, the vibrator unit 9 constituted by the vibrator 10, the relay substrate 100 and the circuit device 20 is housed in the package 3, and then the package 3 is airtightly sealed. Then, lastly, the fine adjustment of the frequency with the internal function of the circuit device 20 is performed (step S25). For example, the capacitance value of the variable capacitance circuit provided to the oscillation circuit 21 of the circuit device 20 is adjusted to thereby perform the final adjustment of the frequency. By performing the process described above, it is possible to realize the manufacturing method capable of manufacturing the vibrator device 2 with the vibration characteristics improved.

3. Physical Quantity Measurement Device

Figure 19:
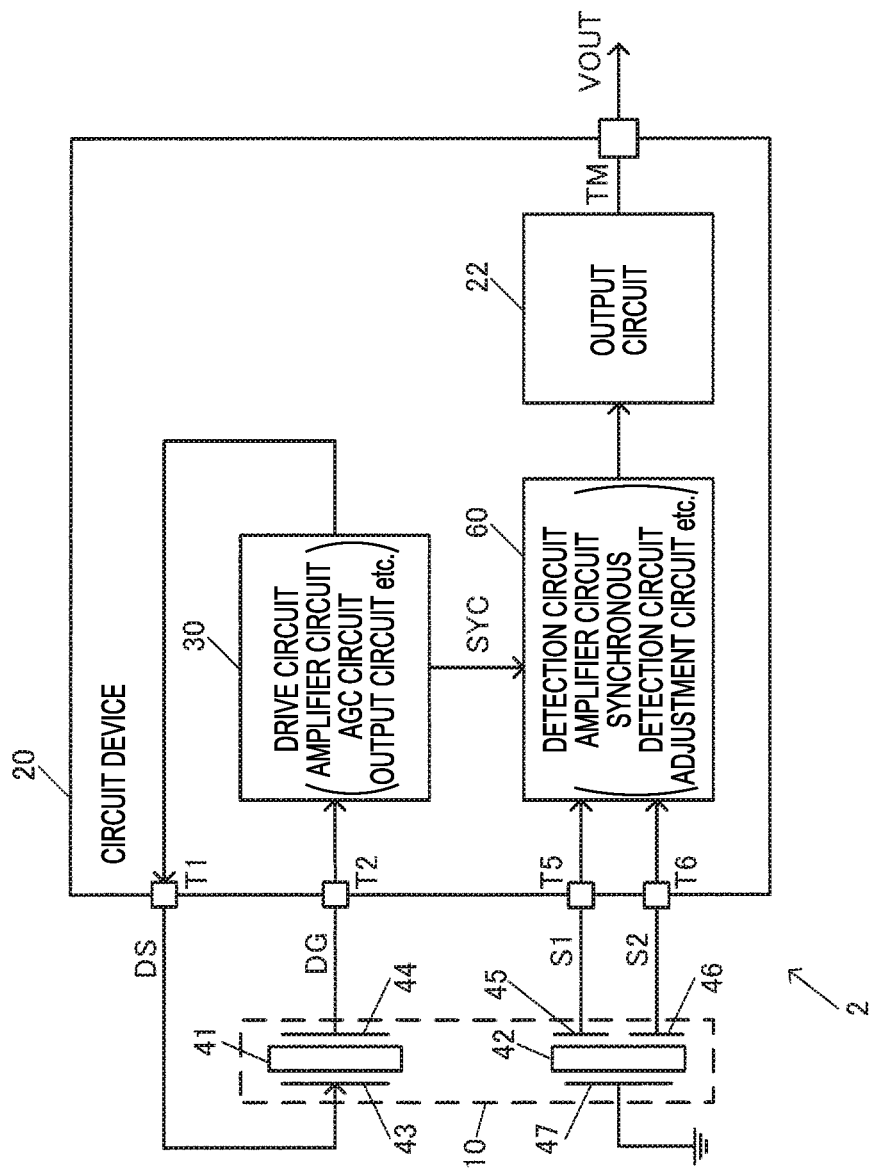
FIG. 19 is a diagram showing a configuration example of the vibrator device as a physical quantity measurement device.
Figure 20:
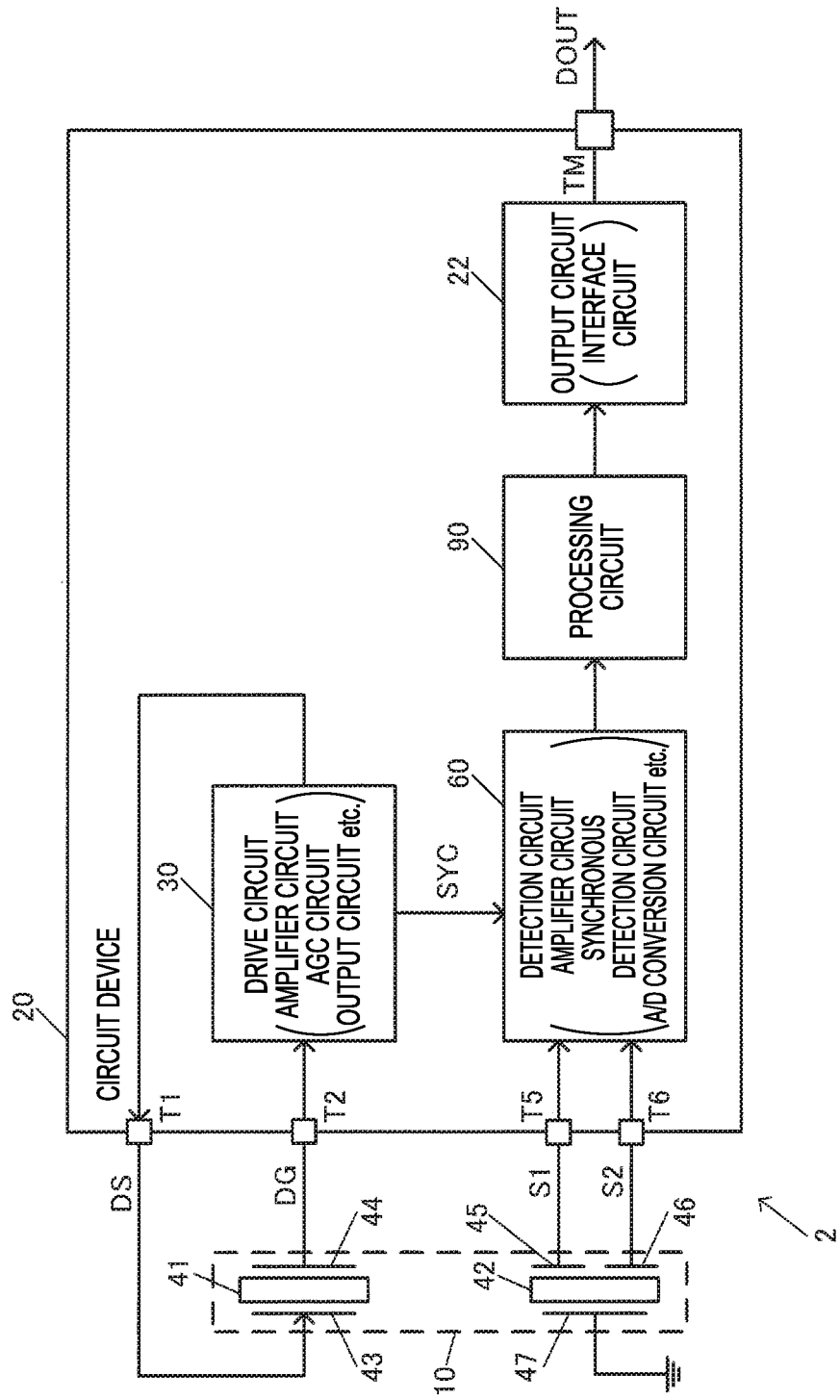
FIG. 20 is a diagram showing a configuration example of the vibrator device as a physical quantity measurement device.

Although the description is hereinabove presented citing the case in which the vibrator device 2 is the oscillator as an example, the vibrator device 2 according to the present embodiment can also be a physical quantity measurement device (a physical quantity detection device) for measuring a physical quantity. As the physical quantity to be measured, there can be assumed a variety of types of physical quantities such as angular velocity, acceleration, angular acceleration, velocity, a distance or time. FIG. 19 and FIG. 20 each show a configuration example of the vibrator device 2 as such a physical quantity measurement device.

The vibrator device 2 shown in FIG. 19 includes the vibrator 10 and the circuit device 20, and the circuit device 20 includes the drive circuit 30, a detection circuit 60 and the output circuit 22. Specifically, the circuit device 20 includes the detection circuit 60 for detecting physical quantity information corresponding to detection signals S1, S2 based on the detection signals S1, S2 from the vibrator 10 driven by the drive circuit 30. Further, the output circuit 22 outputs a detection voltage VOUT as the monitor signal based on a signal from the detection circuit 60.

The vibrator 10 (a sensor element, a physical quantity transducer) is an element for detecting the physical quantity, and has vibrator elements 41, 42, drive electrodes 43, 44, detection electrodes 45, 46 and a ground electrode 47. The vibrator elements 41, 42 are each a piezoelectric type vibrator element formed of a thin plate of a piezoelectric material such as quartz crystal. Specifically, the vibrator elements 41, 42 are each a vibrator element formed of a Z-cut quartz crystal substrate. It should be noted that the piezoelectric material of the vibrator elements 41, 42 can also be a material such as ceramics or silicon other than quartz crystal.

The drive electrode 43 is supplied with the drive signal DS (an output signal in a broad sense) from the drive circuit 30 of the circuit device 20, and thus, the vibrator element 41 for driving vibrates. The vibrator element 41 corresponds to, for example, drive arms 48A through 48D shown in FIG. 21 described later. Further, a feedback signal DG (an input signal in a broad sense) from the drive electrode 44 is input to the drive circuit 30. For example, the feedback signal DG due to the vibration of the vibrator element 41 is input to the drive circuit 30.

Further, the vibrator element 42 for detection vibrates due to the vibration of the vibrator element 41 for driving, and the charge (current) generated by the vibration is input from the detection electrodes 45, 46 to the detection circuit 60 as the detection signals S1, S2. Here, the ground electrode 47 is set to the ground potential (GND). The detection circuit 60 detects the physical quantity information (e.g., angular velocity) corresponding to the detection signals S1, S2 based on these detection signals S1, S2. It should be noted that although the description will hereinafter be presented mainly citing the case in which the vibrator 10 is the gyro sensor element as an example, the present embodiment is not limited to this example, but the vibrator 10 can also be an element for detecting other physical quantities such as acceleration. Further, although such a vibrator element having a double-T structure as shown in, for example, FIG. 21 described later can be used as the vibrator 10, a vibrator element of a tuning-fork type, an H-shape, or the like can also be used.

As shown in FIG. 19, the circuit device 20 includes the terminals T1, T2, T5 and T6, the monitor terminal TM, the drive circuit 30, the detection circuit 60 and the output circuit 22. The drive signal DS as the output signal of the drive circuit 30 is output from the terminal T1 (the first terminal) to the vibrator 10. The feedback signal DG as the input signal from the vibrator 10 to the drive circuit 30 is input to the terminal T2 (the second terminal). The drive circuit 30 can include an amplifier circuit to which the feedback signal DG from the vibrator 10 is input, and which performs signal amplification, an AGC circuit (a gain control circuit) for performing automatic gain control, an output circuit for outputting the drive signal DS to the vibrator 10, and so on. For example, the AGC circuit automatically adjusts the gain in a variable manner so that the amplitude of the feedback signal DG from the vibrator 10 becomes constant. The AGC circuit can be realized by a full-wave rectifier for full-wave rectifying the signal from the amplifier circuit, an integrator for performing an integration process of an output signal of the full-wave rectifier, and so on. The output circuit outputs the drive signal DS as, for example, a rectangular wave. In this case, the output circuit can be realized by a comparator, a buffer circuit and so on. It should be noted that it is possible for the output circuit to output the drive signal DS as a sinusoidal wave. Further, the drive circuit 30 generates a sync signal SYC based on, for example, the output signal of the amplifier circuit to output the sync signal SYC to the detection circuit 60.

The detection circuit 60 can include an amplifier circuit, a synchronous detection circuit, an adjustment circuit and so on. The detection signals S1, S2 from the vibrator 10 are input to the amplifier circuit via the terminals T1, T2, and the amplifier circuit performs a charge-voltage conversion of the detection signals S1, S2 and a signal conversion. The detection signals S1, S2 constitute differential signals. Specifically, the amplifier circuit can include a first Q/V conversion circuit for amplifying the detection signal S1, a second Q/V conversion circuit for amplifying the detection signal S2, and a differential amplifier for performing the differential amplification on the output signals of the first and second Q/V conversion circuits. The synchronous detection circuit performs the synchronous detection using the sync signal SYC from the drive circuit 30. For example, the synchronous detection circuit performs the synchronous detection for extracting a desired wave from the detection signals S1, S2. The adjustment circuit performs an offset adjustment for zero-point correction, and gain correction for adjusting the sensitivity. Further, the detection circuit 60 can include a filter circuit for attenuating the unwanted signal which has failed to completely be removed by the synchronous detection and so on.

The output circuit 22 buffers the detection voltage VOUT from the detection circuit 60, and then output the detection voltage VOUT to the outside as the monitor signal via the monitor terminal TM. Citing the gyro sensor as an example, the detection voltage VOUT is a voltage signal varying in voltage in accordance with the angular velocity detected.

In FIG. 20, unlike FIG. 19, the detection circuit 60 has an A/D conversion circuit. Then, the digital detection data from the detection circuit 60 is input to a processing circuit 90. The processing circuit 90 performs a variety of correction processes such as a correction process for an offset adjustment or a correction process for a sensitivity adjustment based on the detection data from the detection circuit 60. The output circuit 22 outputs the detection data DOUT on which the correction process has been performed from the processing circuit 90 to the outside as the monitor signal via the monitor terminal TM. The output circuit 22 in this case can also be realized by an interface circuit compliant with, for example, I²C or SPI.

Figure 21:
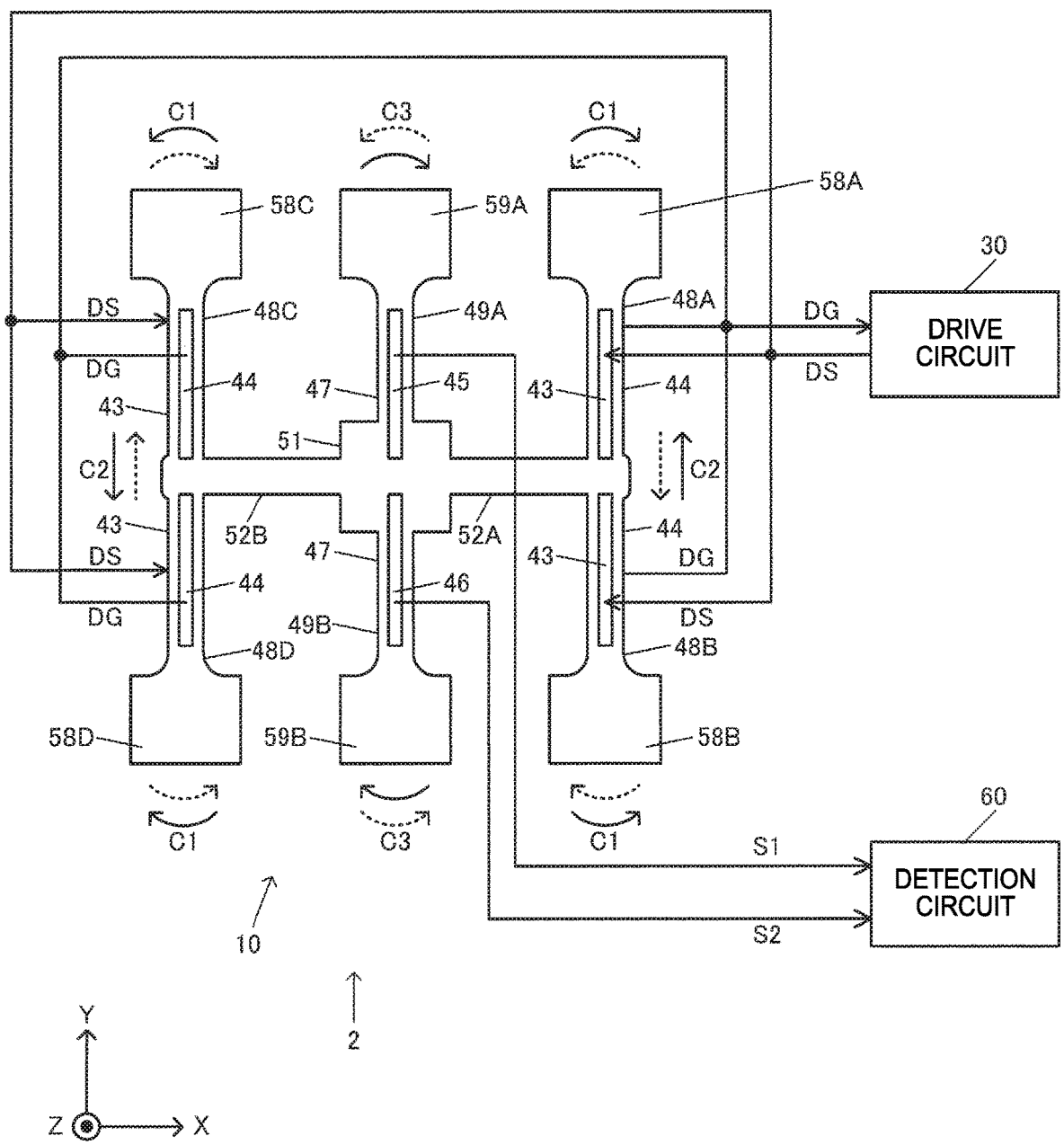
FIG. 21 is an explanatory diagram of an operation of the vibrator device as the physical quantity measurement device.

FIG. 21 shows an example of a configuration of the vibrator 10 having the double-T structure. The vibrator 10 has the drive arms 48A, 48B, 48C and 48D, the detection arms 49A, 49B, abase section 51, and connection arms 52A, 52B. The detection arms 49A, 49B extend in the +Y-axis direction and the −Y-axis direction, respectively, with respect to the base section 51 having a rectangular shape. Further, the connection arms 52A, 52B extend in the +X-axis direction and the −X-axis direction, respectively, with respect to the base section 51. Further, the drive arms 48A, 48B extend from a tip part of the connection arm 52A in the +Y-axis direction and the −Y-axis direction, respectively, and the drive arms 48C, 48D extend from a tip part of the connection arm 52B in the +Y-axis direction and the −Y-axis direction, respectively. Weight parts 58A, 58B, 58C and 58D (hammer heads) large in width disposed on the tip side of the drive arms 48A, 48B, 48C and 48D, and weight parts 59A, 59B (hammer heads) large in width disposed on the tip side of the detection arms 49A, 49B are used as weights for adjusting the frequency. Defining the Z axis as a thickness direction of the vibrator 10, the vibrator 10 detects an angular velocity around the Z axis. The X axis and the Y axis are coordinate axes perpendicular to the Z axis, and the X axis and the Y axis are perpendicular to each other. The X axis, the Y axis, and the Z axis are also called the electrical axis, the mechanical axis, and the optical axis of a quartz crystal substrate, respectively.

The drive electrode 43 is formed on an upper surface and a lower surface of each of the drive arms 48A, 48B, and the drive electrode 44 is formed on a right side surface and a left side surface of each of the drive arms 48A, 48B. The drive electrode 44 is formed on an upper surface and a lower surface of each of the drive arms 48C, 48D, and the drive electrode 43 is formed on a right side surface and a left side surface of each of the drive arms 48C, 48D. Further, the drive signal DS (the output signal in a broad sense) from the drive circuit 30 is supplied to the drive electrode 43 (the first electrode in a broad sense), and the feedback signal DG (the input signal in abroad sense) from the drive electrode 44 (the second electrode in abroad sense) is input to the drive circuit 30. The detection electrode 45 is formed on an upper surface and a lower surface of the detection arm 49A, and the ground electrode 47 is formed on a right side surface and a left side surface of the detection arm 49A. The detection electrode 46 is formed on an upper surface and a lower surface of the detection arm 49B, and the ground electrode 47 is formed on a right side surface and a left side surface of the detection arm 49B. Further, the detection signals S1, S2 from the detection electrodes 45, 46 are input to the detection circuit 60.

Then, an operation of the vibrator device 2 will be described using FIG. 21. When the drive signal DS is applied by the drive circuit 30 to the drive electrode 43, the drive arms 48A, 48B, 48C and 48D perform a flexural vibration (an excitation vibration) as indicated by the arrows C1 shown in FIG. 21 due to the inverse piezoelectric effect. For example, the vibrational posture represented by the solid arrows and the vibrational posture represented by the dotted arrows are repeated at a predetermined frequency. In other words, there is performed the flexural vibration in which the tips of the drive arms 48A, 48C repeat coming closer to and getting away from each other, and the tips of the drive arms 48B, 48D also repeat coming closer to and getting away from each other. On this occasion, since the pair of drive arms 48A and 48B and the pair of drive arms 48C and 48D respectively perform the vibrations line symmetric about the X axis passing through the centroid position of the base section 51, the base section 51, the connection arms 52A, 52B and the detection arms 49A, 49B hardly vibrate.

If the angular velocity having the Z axis as the rotational axis is applied to the vibrator 10 (if the vibrator 10 rotates around the Z axis) in this state, the drive arms 48A, 48B, 48C and 48D vibrate in such a manner as indicated by the arrows C2 due to the Coriolis force. In other words, by the Coriolis force in the direction of the arrows C2 perpendicular to the direction of the arrows C1 and the direction of the Z axis acting on the drive arms 48A, 48B, 48C and 48D, the vibration component in the direction of the arrows C2 is generated. The vibration of the arrows C2 propagates to the base section 51 via the connection arms 52A, 52B, and thus, the detection arms 49A, 49B perform a flexural vibration in the direction of the arrows C3. A charge signal generated due to the piezoelectric effect by the flexural vibration of the detection arms 49A, 49B is input to the detection circuit 60 as the detection signals S1, S2, and thus, the angular velocity around the Z axis becomes to be detected. For example, defining the angular velocity of the vibrator 10 around the Z axis as ω, the mass as m, and the vibration velocity as v, the Coriolis force Fc is expressed as follows.

$$Fc = 2m \cdot v \cdot \omega$$

Therefore, by the detection circuit 60 detecting the desired signal as a signal corresponding to the Coriolis force, the angular velocity ω around the Z axis can be obtained.

The weight parts 58A through 58D, 59A and 59B shown in FIG. 21 are each provided with a mass adjusting film (not shown). By irradiating a part of the mass adjusting film with an ion beam (an electron beam) or a laser beam to remove (trim) that part, it is possible to adjust, for example, the drive frequency (the resonance frequency in a drive mode) and the detection frequency (the resonance frequency in a detection mode). Thus, it is possible to perform an adjustment of a detuning frequency (a difference between the drive frequency and the detection frequency) and a zero-point adjustment of a gyro device, and so on. Further, in the present embodiment, in FIG. 19 through FIG. 21, in the state in which the vibrator 10 is driven by the drive circuit 30, it is possible to support the vibrator 10 on the active surface side of the circuit device 20 using the conductive bumps provided to the terminals T1, T2 of the circuit device 20 and the dummy terminals (T3, T4). Then, it is possible to remove a part of the mass adjusting film of each of the weight parts 58A through 58D, 59A and 59B shown in FIG. 21 while driving the vibrator 10 with the drive circuit 30. On this occasion, since it is possible to output the detection voltage VOUT and the detection data DOUT as the monitor signal to the external measurement device in FIG. 19 and FIG. 20, it becomes possible to monitor the vibration characteristics of the vibrator 10 varying in accordance with the adjustment by removing the mass adjusting film. Therefore, it is possible to improve the vibration characteristics of the vibrator 10, and it becomes possible to achieve an improvement of the detection accuracy of the physical quantity such as angular velocity by the physical quantity measurement device.

4. Electronic Apparatus, Vehicle

Figure 22:
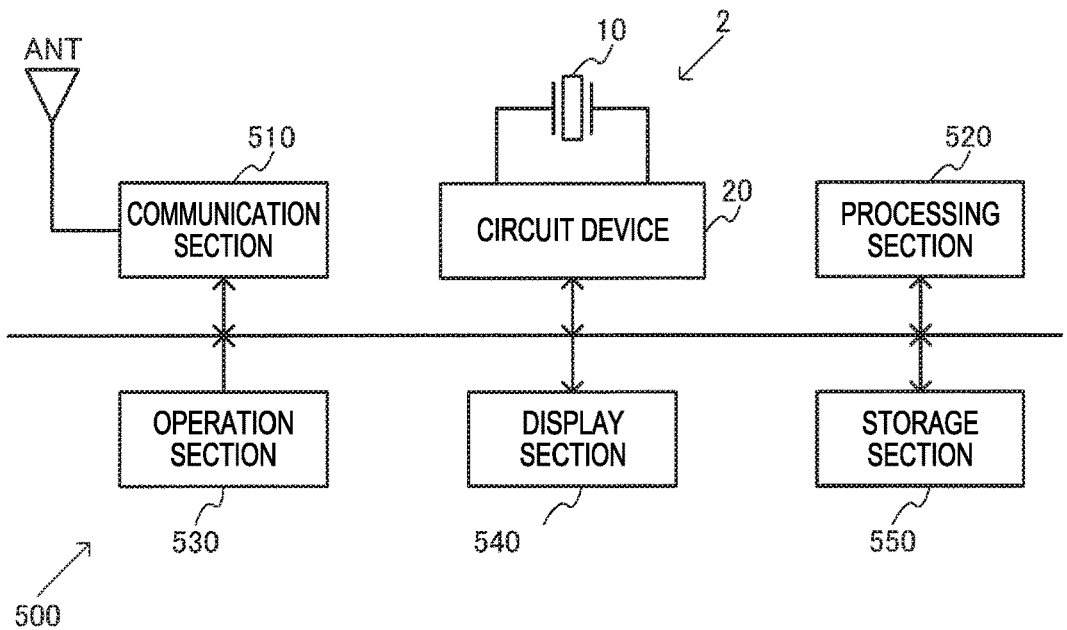
FIG. 22 is a diagram showing a configuration example of an electronic apparatus.

FIG. 22 shows a configuration example of an electronic apparatus 500 including the vibrator device 2 (the circuit device 20) according to the present embodiment. The electronic apparatus 500 includes the vibrator device 2 having the circuit device 20 and the vibrator 10, and a processing section 520. Further, the electronic apparatus 500 can include a communication section 510, an operation section 530, a display section 540, a storage section 550, and an antenna ANT.

As the electronic apparatus 500, there can be assumed, for example, a network-related apparatus such as a base station or a router, a highly accurate measurement instrument for measuring a physical quantity such as a distance, time, flow speed, or a flow rate, a biological information measurement apparatus (e.g., a ultrasonic measurement device, a sphygmograph, and a blood-pressure measurement device) for measuring biological information, an in-car apparatus (e.g., equipment for automated driving). Further, as the electronic apparatus 500, there can be assumed a wearable apparatus such as a head-mounted display device, or a timepiece related apparatus, a robot, a printer, a projection apparatus, a portable information terminal (e.g., a smartphone), a content supply terminal for delivering contents, or a video apparatus such as a digital camera or a video camera.

The communication section 510 (a communication interface) performs a process of receiving data externally via the antenna ANT and transmitting data to the outside. The processing section 520 (a processor) performs a control process of the electronic apparatus 500, a variety of types of digital processing of the data transmitted or received via the communication section 510. The function of the processing section 520 can be realized by a processor such as a microcomputer. The operation section 530 (an operation interface) is for the user to perform an input operation, and can be realized by operation buttons, a touch panel display, or the like. The display section 540 is for displaying a variety of types of information, and can be realized by a display using a liquid crystal, an organic EL, or the like. The storage section 550 is for storing the data, and the function thereof can be realized by a semiconductor memory such as a RAM or a ROM, a hard disk drive (HDD), or the like.

Figure 23:
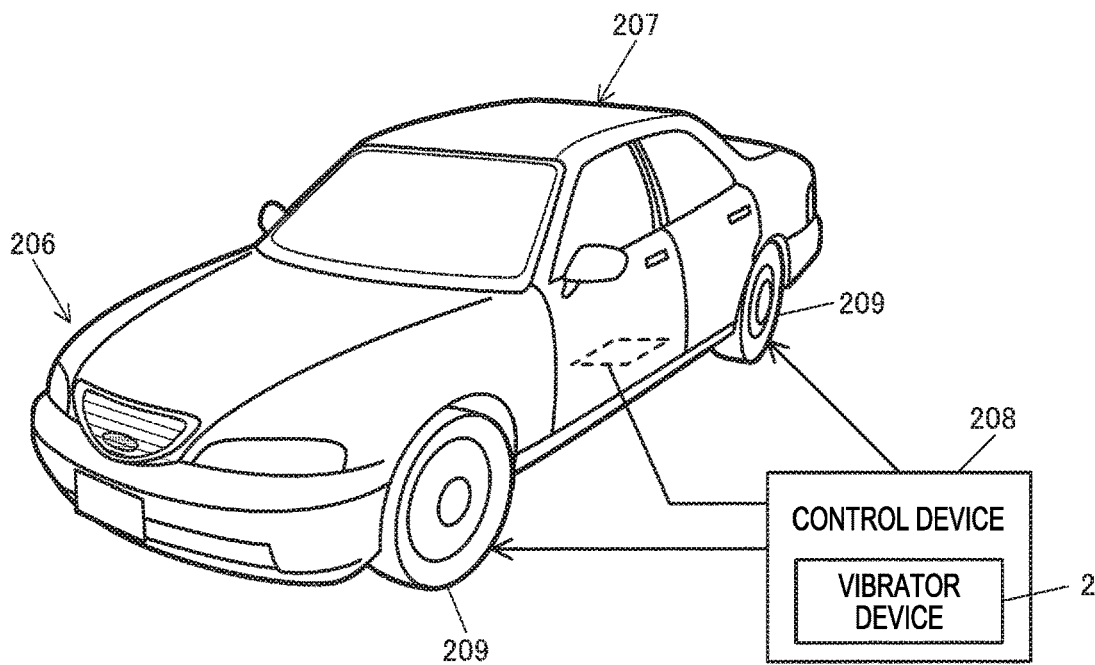
FIG. 23 is a diagram showing a configuration example of a vehicle.

FIG. 23 shows an example of a vehicle including the vibrator device 2 (the circuit device 20) according to the present embodiment. The vibrator device 2 (the oscillator, the physical quantity measurement device) according to the present embodiment can be incorporated in a variety of types of vehicles such as a car, an airplane, a motorbike, a bicycle, a robot, a ship, and a boat. The vehicle is equipment or an apparatus, which is provided with a drive mechanism such as an engine or an electric motor, a steering mechanism such as a steering wheel or a helm, and a variety of electronic apparatuses (in-car equipment), and moves on the ground, in the air, or on the sea. FIG. 23 schematically shows a car 206 as a specific example of the vehicle. The car 206 incorporates the vibrator device 2 according to the present embodiment. A control device 208 performs a variety of control processes based on the clock signal generated by the vibrator device 2 and the physical quantity information measured by the vibration device 2. For example, in the case in which the distance information of an object located in the periphery of the car 206 is measured as the physical quantity information, the control device 208 performs a variety of control processes for the automated driving using the distance information thus measured. The control device 208 controls the stiffness of the suspension in accordance with, for example, the attitude of a car body 207, and controls the brake of each of the wheels 209. It should be noted that the apparatus incorporating the vibrator device 2 according to the present embodiment is not limited to such a control device 208, but the vibrator device 2 according to the present embodiment can be incorporated in a variety of apparatuses provided to the vehicle such as the car 206 or a robot.

It should be noted that although the present embodiment is hereinabove described in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the invention. Further, the configurations and the operations of the vibrator device, the circuit device, the electronic apparatus, and the vehicle, and the layout configuration, the connection configuration and so on of the vibrator, the relay substrate and the circuit device in the vibrator device are not limited to those described in the present embodiment, but can be implemented with a variety of modifications.

The entire disclosure of Japanese Patent Application No. 2018-001086, filed Jan. 9, 2018 is expressly incorporated by reference herein.

What is claimed is:

1. A vibrator device comprising:
a vibrator having a first electrode and a second electrode; and
a circuit device having a drive circuit configured to drive the vibrator, and an output circuit configured to output a monitor signal corresponding to a vibration characteristic of the vibrator while being driven by the drive circuit,
wherein the circuit device includes
a first terminal electrically coupled to the first electrode, and from which an output signal from the drive circuit to the vibrator is output,
a second terminal electrically coupled to the second electrode, and to which an input signal from the vibrator to the drive circuit is input,
a third terminal electrically separated from the first electrode and the second electrode, and
a monitor terminal from which the monitor signal is output, and
the vibrator is supported on an active surface of the circuit device with conductive bumps provided respectively to the first terminal, the second terminal and the third terminal.

2. The vibrator device according to claim 1, wherein
a first area and a second area are sectioned by a center line in a plan view of the active surface of the circuit device, the first terminal and the second terminal are disposed in the first area, and the third terminal is disposed in the second area.

3. The vibrator device according to claim 1, wherein
the drive circuit is disposed at a position nearer to the first terminal and the second terminal than to the third terminal.

4. The vibrator device according to claim 1, further comprising:
a relay substrate disposed between the vibrator and the circuit device, and having an interconnection electrically connecting the first terminal of the circuit device and the first electrode of the vibrator, and an interconnection electrically connecting the second terminal of the circuit device and the second electrode of the vibrator,
wherein the relay substrate is supported by the conductive bumps of the first terminal, the second terminal and the third terminal of the circuit device, and the vibrator is supported on the active surface side of the circuit device via the relay substrate.

5. The vibrator device according to claim 1, wherein
a circuit device includes a fourth terminal electrically separated from the first electrode and the second electrode, and
the vibrator is supported on the active surface of the circuit device with the conductive bumps provided respectively to the first terminal, the second terminal and the third terminal, and a conductive bump provided to the fourth terminal.

6. The vibrator device according to claim 1, wherein
the monitor terminal is disposed at a position shifted from the vibrator in the plan view of the active surface of the circuit device.

7. The vibrator device according to claim 1, wherein
the circuit device includes an oscillation circuit having the drive circuit, and configured to drive the vibrator with the drive circuit to oscillate the vibrator, and
the output circuit outputs the monitor signal based on a signal from the oscillation circuit.

8. The vibrator device according to claim 1, wherein
the circuit device includes a detection circuit configured to detect physical quantity information corresponding to a detection signal from the vibrator driven by the drive circuit based on the detection signal, and
the output circuit outputs the monitor signal based on a signal from the detection unit.

9. The vibrator device according to claim 1, wherein
the monitor signal is a signal representing the vibration characteristic varying by an adjustment when the vibrator is processed to adjust the vibration characteristic.

10. The vibrator device according to claim 1, wherein
an area of the monitor terminal is larger than an area of each of the first terminal, the second terminal and the third terminal.

11. The vibrator device according to claim 1, wherein
the circuit device has a rectangular shape in the plan view of the active surface, and
the monitor terminal is disposed in one corner region out of four corner regions of the circuit device.

12. The vibrator device according to claim 11, wherein
the circuit device includes a first power supply terminal to which high potential side power is supplied when monitoring the vibration characteristic, and a second power supply terminal to which low potential side power is supplied when monitoring the vibration characteristic, and
the first power supply terminal and the second power supply terminal are disposed in other corner regions than the one corner region out of the four corner regions.

13. The vibrator device according to claim 1, wherein
the circuit device has a signal terminal to electrically be connected to an external terminal of the vibrator device, and
the signal terminal is disposed at a position shifted from the vibrator in the plan view of the active surface of the circuit device.

14. The vibrator device according to claim 13, wherein
a height in a cross-sectional view of the signal terminal is higher than a height in the cross-sectional view of the monitor terminal.

15. The vibrator device according to claim 1, wherein
the circuit device is mounted face-down to a package of the vibrator device.

16. An electronic apparatus comprising:
the vibrator device according to claim 1.

17. A vehicle comprising:
the vibrator device according to claim 1.

18. A circuit device comprising:
a drive circuit configured to drive a vibrator having a first electrode and a second electrode;

an output circuit configured to output a monitor signal corresponding to a vibration characteristic of the vibrator while being driven by the drive circuit;

a first terminal electrically coupled to the first electrode, and from which an output signal from the drive circuit to the vibrator is output;

a second terminal electrically coupled to the second electrode, and to which an input signal from the vibrator to the drive circuit is input;

a third terminal electrically separated from the first electrode and the second electrode; and a monitor terminal from which the monitor signal is output, wherein the first terminal, the second terminal and the third terminal are respectively provided with conductive bumps adapted to support the vibrator on an active surface side of the circuit device.

19. A method of manufacturing a vibrator device comprising:

manufacturing a circuit device having a drive circuit configured to drive a vibrator having a first electrode and a second electrode, an output circuit configured to output a monitor signal corresponding to a vibration characteristic of the vibrator while being driven by the drive circuit, a monitor terminal from which the monitor signal is output, a first terminal from which an output signal from the drive circuit to the vibrator is output, a second terminal to which an input signal from the vibrator to the drive circuit is input, and a third terminal; and arranging the vibrator and the circuit device so that the first terminal and the first electrode are electrically connected, the second terminal and the second electrode are electrically connected, the third terminal is electrically separated from the first electrode and the second electrode, and the vibrator is supported on an active surface of the circuit device with conductive bumps provided to the first terminal, the second terminal and the third terminal.

* * * * *